United States Patent
Nishihara et al.

(10) Patent No.: US 12,127,416 B2
(45) Date of Patent: Oct. 22, 2024

(54) MOLECULAR MEMORY AND METHOD FOR MANUFACTURING MOLECULAR MEMORY

(71) Applicant: HIROSHIMA UNIVERSITY, Higashihiroshima (JP)

(72) Inventors: Sadafumi Nishihara, Higashihiroshima (JP); Masaru Fujibayashi, Higashihiroshima (JP); Katsuya Inoue, Higashihiroshima (JP); Masahiro Sadakane, Higashihiroshima (JP)

(73) Assignee: HIROSHIMA UNIVERSITY, Hiroshima (JP)

( * ) Notice: Subject to any disclaimer, the term of this patent is extended or adjusted under 35 U.S.C. 154(b) by 456 days.

(21) Appl. No.: 17/639,579

(22) PCT Filed: Jul. 16, 2020

(86) PCT No.: PCT/JP2020/027690
§ 371 (c)(1),
(2) Date: Mar. 1, 2022

(87) PCT Pub. No.: WO2021/044743
PCT Pub. Date: Mar. 11, 2021

(65) Prior Publication Data
US 2022/0302398 A1    Sep. 22, 2022

(30) Foreign Application Priority Data
Sep. 2, 2019    (JP) .................................. 2019-159643

(51) Int. Cl.
*H10B 53/30*    (2023.01)
*C01B 25/45*    (2006.01)
(Continued)

(52) U.S. Cl.
CPC ........... *H10K 10/701* (2023.02); *C01B 25/45* (2013.01); *H10B 53/30* (2023.02); *H10K 10/50* (2023.02); *H10K 19/202* (2023.02)

(58) Field of Classification Search
CPC .......... B82Y 10/00; C01B 25/45; H10B 53/30
See application file for complete search history.

(56) References Cited

U.S. PATENT DOCUMENTS

2006/0046344 A1 * 3/2006 Liljedahl ................ B82Y 10/00
                                                             438/99

FOREIGN PATENT DOCUMENTS

| JP | 2017-095334 A | 6/2017 |
| JP | 2018-032813 A | 3/2018 |
| JP | 2021-005644 A | 1/2021 |

OTHER PUBLICATIONS

Kato, Chisato et al., "Giant hystereic single-molecule electric polarisation switching above room temperature" Angew. Chem. Int. Ed., Aug. 17, 2018, 57, pp. 13429-13432.
(Continued)

*Primary Examiner* — Daniel P Shook
(74) *Attorney, Agent, or Firm* — Maschoff Brennan

(57) ABSTRACT

A molecular memory recording molecular polarization of a single-molecule electret, and the single-molecule electret includes a cluster skeleton 100 having a continuous hole 101 and a plurality of stable ionic sites 102a, 102b and a metal ion M. The molecular polarization is shown in a state in which the metal ion is included in the stable ionic site. The molecular polarization is changed by movement of the metal ion to the other hollow stable ionic site by application of an electric field. The recordkeeping time of the molecular memory in a temperature range of −100° C. to 100° C. based on the ion radius of the metal ion is $3.0 \times 10^{-2}$ seconds to $9.1 \times 10^{22}$ seconds. Based on the recordkeeping time, the
(Continued)

12 : M = Tb³⁺
13 : M = Na⁺ molecular memory is used as any of a volatile memory, a non-volatile memory, and a storage class memory.

20 Claims, 37 Drawing Sheets

(51) Int. Cl.
    *H10K 10/00*     (2023.01)
    *H10K 10/50*     (2023.01)
    *H10K 19/00*     (2023.01)

(56)     References Cited

OTHER PUBLICATIONS

Hayashi et al., "Preparation of Preyssler-type Phosphotungstate with One Central Potassium Cation and Potassium Cation Migration into the Preyssler Molecule to form Di-Potassium-Encapsulated Derivative" ACS Omega, 2018, 3, 2363-2373, Apr. 8, 2019.

Fernandez et al., "Polyoxometalates with Internal Cavities: Redox Activity, Basicity, and Cation Encapsulation in $[X_n{}^+P_5W_{30}O_{110}]^{(15-n)}$-Preyssler Complexes, with X ) $Na^+$, $Ca^{2+}$, $Y^{3+}$, $La^{3+}$, $Ce^{3+}$, and $Th^{4+}$" JACS Articles, Sep. 14, 2007.

Zhang et al., "A new heart-like Co-containing polyoxoanion based on the lacunary Preyssler anion" Dalton Trans., 2008, 2051-3053, May 8, 2008.

* cited by examiner

12 : M = Tb$^{3+}$
13 : M = Na$^+$

12 : M = Tb$^{3+}$
13 : M = Na$^+$

MOLECULAR MEMORY AND METHOD FOR MANUFACTURING MOLECULAR MEMORY

TECHNICAL FIELD

The present invention relates to a molecular memory and the method for manufacturing the molecular memory.

BACKGROUND ART

A ferroelectric material has an electric dipole in a crystal, and the electric dipole is aligned in the crystal even in a state in which there is no electric field. For the ferroelectric material, the polarization direction and level of the electric dipole are controllable by application of an electric field. A change in the polarization direction and level by application of the electric field occurs due to movement of a ferroelectric domain wall. Even when the electric field is cut off, the ferroelectric domain wall does not fully return to an original state, and for this reason, P-E hysteresis occurs. Thus, the ferroelectric material can record information depending on the direction of the polarization remaining in the state without the electric field.

Meanwhile, there has been a single-molecule electret capable of showing ferroelectric properties and behavior with a single molecule. The ferroelectric properties and behavior indicate appearance of the P-E hysteresis and spontaneous polarization. Unlike the mechanism for causing hysteresis in a general ferroelectric material, the single-molecule electret shows the P-E hysteresis and the spontaneous polarization based on a slow polarization relaxation phenomenon.

One of molecular structures used for the single-molecule electrets is Preyssler-type polyoxometalate (POM). The Preyssler-type POM is a molecular metal oxide cluster having a ring-shaped structure. The Preyssler-type POM is represented by $[M^{n+}:P_5W_{30}O_{110}]^{(15-n)-}$. Note that "$P_5W_{30}O_{110}$" indicates a cluster skeleton and "$M^{n+}$" indicates a metal ion included in the cluster skeleton. In the cluster skeleton of the Preyssler-type POM, two stable ionic sites shifted from the center are present. An ion taken into the cluster skeleton is stably held in any of the stable ionic sites.

For example, Patent Document 1 discloses that a molecular metal oxide cluster which is stable in holding molecular polarization and stable in terms of a structure can be provided.

Patent Document 2 discloses that a multiferroic material including a dysprosium ion in one inclusion portion of a cluster skeleton shows P-E hysteresis and magnetic hysteresis with a single molecule.

Patent Document 3 discloses that a molecular metal oxide cluster showing molecular polarization functions as a memory when used as a single-molecule electret layer in a field-effect transistor.

Non-Patent Document 1 discloses such a polyoxometalate molecule that a potassium ion is included in a cluster skeleton.

There are three general types of memories often distributed in the market. These memories include a volatile memory that loses stored contents when the power is turned off, such as a DRAM and a SRAM; a non-volatile memory that holds contents for a long period of time even after the power has been turned off, such as a ROM and a flash memory; and a storage class memory having intermediate properties between the volatile memory and the non-volatile memory. The storage class memory that holds contents for a short period of time even after the power has been turned off can be provided with a higher speed and a larger capacity, and can be produced at low cost. Thus, the storage class memory has recently attracted attention as a new memory.

CITATION LIST

Patent Document

PATENT DOCUMENT 1: Japanese Unexamined Patent Publication No. 2017-95334
PATENT DOCUMENT 2: Japanese Unexamined Patent Publication No. 2018-32813
PATENT DOCUMENT 3: Japanese Patent Application No. 2019-118917

Non-Patent Document

NON-PATENT DOCUMENT 1: Akio Hayashi, Muh. Nur Khoiru Wihadi, Hiromi Ota, Xavier Lopez, Katsuya Ichihashi, Sadafumi Nishihara, Katsuya Inoue, Nao Tsunoji, Tsuneji Sano, Masahiro Sadakane, "Preparation of Preyssler-type Phosphotungstate with One Central Potassium Cation and Potassium Cation Migration into the Preyssler Molecule to form Di-Potassium-Encapsulated Derivative," ACS Omega 2018, 3, 2363-2373

SUMMARY OF THE INVENTION

Technical Problem

Patent Documents 1 to 3 merely describe that a particular molecular metal oxide cluster is applicable to some electronic devices. The molecular metal oxide clusters described in Patent Documents 1 to 3 cannot be applied to the volatile memory, the non-volatile memory, and the storage class memory in a versatile manner, and in some cases, are not suitable depending on a memory type. For this reason, further findings are necessary for thoughtfully using the molecular metal oxide cluster and applying the molecular metal oxide cluster to various memories for promoting the practical use of the molecular metal oxide cluster as a molecular memory.

The present disclosure has been made in view of the above-described situation, and is intended to provide a molecular memory configured such that a recordkeeping time is controllable across a wide range and configured applicable to various memories based on the recordkeeping time.

Solution to the Problem

For accomplishing the above-described objective, the molecular memory of the present embodiment is a molecular memory including a single-molecule electret layer having a single-molecule electret showing molecular polarization and recording the molecular polarization of the single-molecule electret in association with a signal of 0 or 1. The single-molecule electret includes a cluster skeleton having a continuous hole and a plurality of stable ionic sites provided apart from each other in the continuous hole and a metal ion included in any one of the stable ionic sites and formed movable to the other hollow stable ionic site. The molecular polarization is shown in a state in which the metal ion is included in any one of the stable ionic sites. The molecular polarization is changed by movement of the metal ion to the other hollow stable ionic site by application of an electric field. The recordkeeping time of the molecular memory in a temperature range of −100° C. to 100° C. based on the ion radius of the metal ion is $3.0 \times 10^{-2}$ seconds to $9.1 \times 10^{22}$ seconds. Based on the recordkeeping time, the molecular memory is used as any of a volatile memory, a non-volatile memory, and a storage class memory.

Advantages of the Invention

According to the present embodiment, the molecular memory configured such that the recordkeeping time is controllable across the wide range and configured applicable to various memories based on the recordkeeping time can be obtained.

DESCRIPTION OF EMBODIMENTS

Hereinafter, the present embodiment will be described in detail with reference to the drawings. Description of the preferred embodiment below is merely an example in nature, and changes can be made as necessary without departing from the gist of the present invention.

Molecular Structure of Single-Molecule Electret

Figure 1:
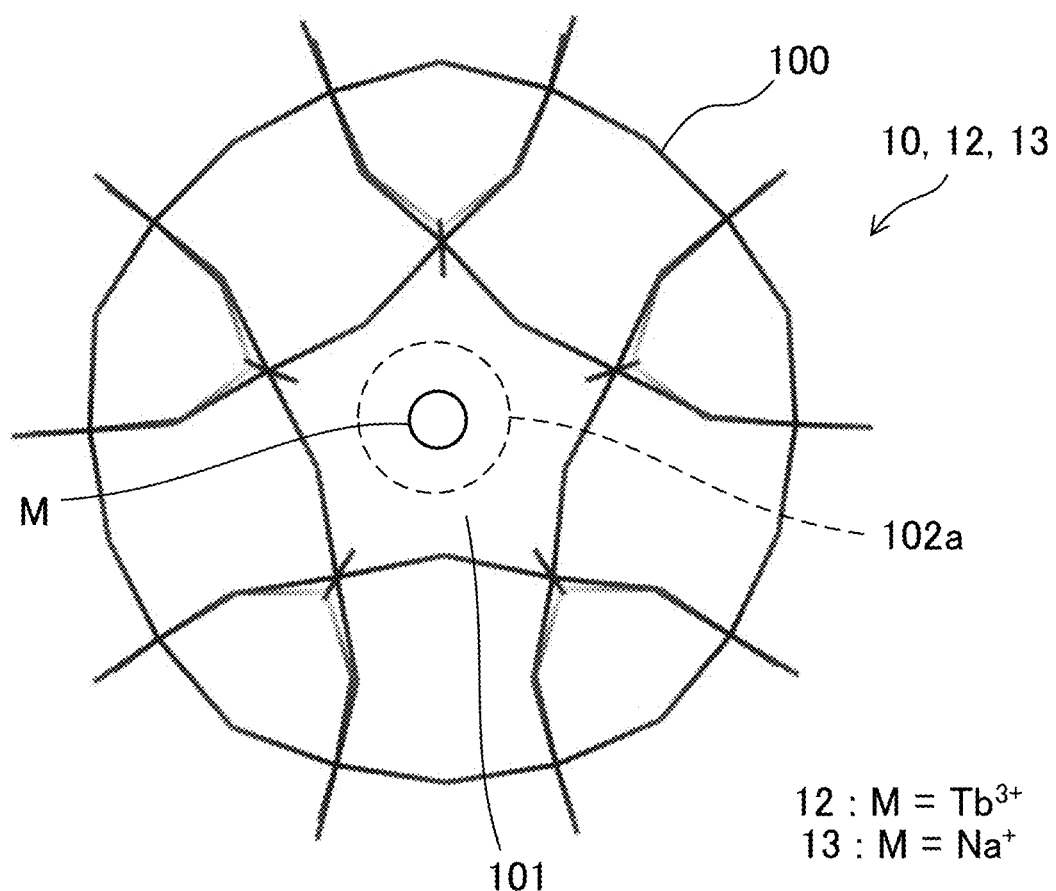
FIG. 1 is a schematic diagram showing, as viewed in plane, one example of a molecular structure of a single-molecule electret according to an embodiment.
Figure 2:
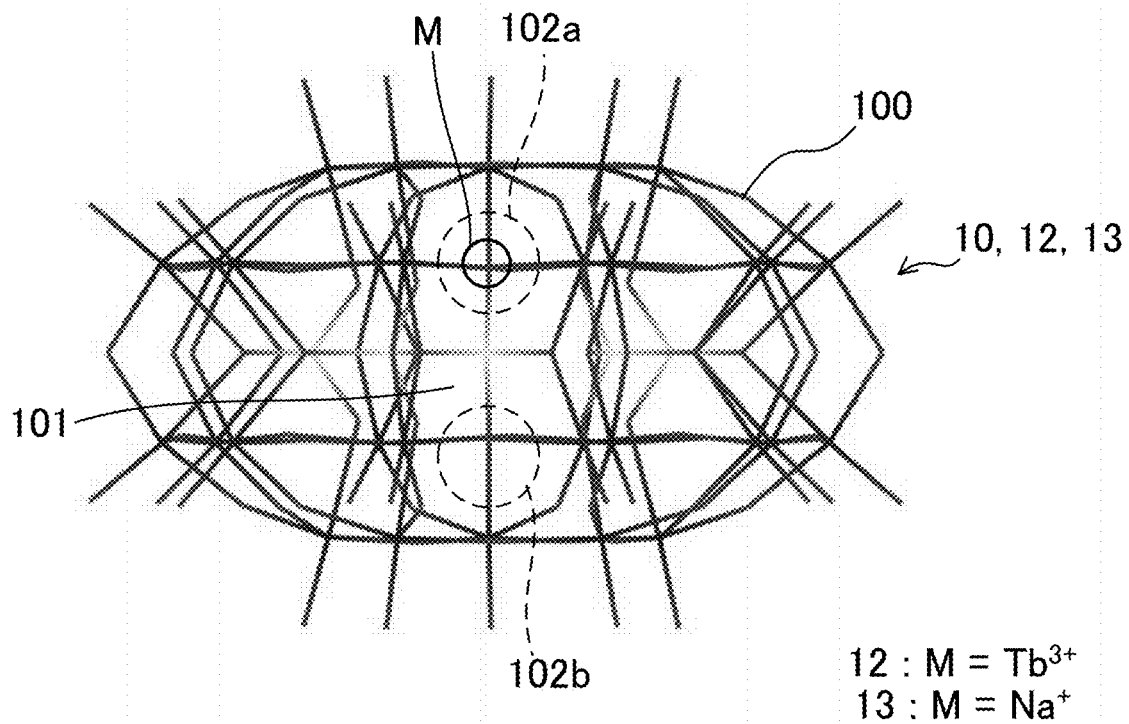
FIG. 2 is a schematic diagram showing, as viewed from the side, one example of the molecular structure of the single-molecule electret according to the embodiment.

FIG. 1 is a schematic diagram showing, as viewed in plane, one example of a molecular metal oxide cluster as a molecular structure of a single-molecule electret according to the present embodiment, and FIG. 2 is a schematic diagram from the side. As shown in FIGS. 1 and 2, the molecular metal oxide cluster 10 has a cluster skeleton 100 and a metal ion M.

Cluster Skeleton

The cluster skeleton 100 has a plurality of stable ionic sites 102a, 102b provided apart from each other in a continuous hole 101. In the present embodiment, the cluster skeleton 100 is a polyoxometalate skeleton having two stable ionic sites 102a, 102b in one continuous hole 101 and represented by a chemical formula of $P_5W_{30}O_{110}$. The cluster skeleton 100 is in the shape of a substantially flat spheroid formed short in a rotation axis direction and long in a radial direction, has one continuous hole 101 extending along a rotation axis of the substantially flat spheroid, and has the stable ionic sites 102a, 102b for the metal ion M on one and the other opening sides in the continuous hole 101. Of two stable ionic sites 102a, 102b, one stable ionic site 102a has the metal ion M, and the other stable ionic site 102b is hollow. The term "hollow" indicates an empty state in which no ion or molecule is present and nothing is included.

Metal Ion

The metal ion M is included in any one of the stable ionic sites, and is movable to the other hollow stable ionic site. In a state in which the metal ion M is included in any one of the stable ionic sites, the single-molecule electret shows molecular polarization. In the present embodiment, the metal ion M included in the cluster skeleton 100 is movable between two stable ionic sites 102a, 102b in the continuous hole 101, and is stable with the metal ion M being included in any of the stable ionic sites 102a, 102b. When the metal ion M moves from one stable ionic site 102a to the other hollow stable ionic site 102b, energy exceeding activation energy is required. In X-ray crystallography, it has been confirmed that disorder of the metal ion M occurs in an axial direction in the cluster skeleton 100.

In the case of using the cluster skeleton 100, the metal ion M is preferably one type selected from a group consisting of sodium ions ($Na^+$) and lanthanoid ions. For example, the metal ion M is one type selected from a group consisting of a sodium ion ($Na^+$), a gadolinium ion ($Gd^{3+}$), a terbium ion ($Tb^{3+}$), a dysprosium ion ($Dy^{3+}$), a holmium ion ($Ho^{3+}$), an erbium ion ($Er^{3+}$), a thulium ion ($Tm^{3+}$), and an ytterbium ion ($Yb^{3+}$). The molecular metal oxide cluster 10 including any of the above-described metal ions M shows the molecular polarization.

In the case of using other metal ions such as a calcium ion ($Ca^{2+}$), a praseodymium ion ($Pr^{3+}$), a neodymium ion ($Nd^{3+}$), a samarium ion ($Sm^{3+}$), a europium ion ($Eu^{3+}$), a lutetium ion ($Lu^{3+}$), a cerium ion ($Ce^{4+}$, $Ce^{3+}$), an yttrium ion ($Y^{3+}$), a bismuth ion ($Bi^{3+}$), a uranium ion ($U^{4+}$), a lanthanum ion ($La^{3+}$), and a thorium ion ($Th^{4+}$), the molecular metal oxide cluster 10 is also stable, and is common to the above-described lanthanoid ions in terms of, e.g., an ion radius and electronic properties. Thus, it can be estimated that such a molecular metal oxide cluster 10 also similarly shows the molecular polarization (see Jorge A. Fernandez, Xavier Lopez, Carles Bo, Coen de Graaf, Evert J. Baerends, Josep M. Poblet, J. Am. Chem. Soc. 2007, 129, 40, 12244-12253).

In a case where the cluster skeleton is a polyoxometalate skeleton other than the cluster skeleton 100 represented by a chemical formula of $P_5W_{30}O_{110}$, other metal ions such as a potassium ion ($K^+$) may be used as the metal ion M. Alternatively, as the cluster skeleton, a fullerene which can include a metal ion or other inclusion compounds may be also applied. In a case where the cluster skeleton has a plurality of metal ions M, these metal ions M are not limited to one type and may be of two or more types.

In a low temperature range, thermal energy carried by the included metal ion M is smaller than the activation energy formed between the stable ionic sites 102a, 102b in the molecule, and for this reason, the metal ion M cannot move from any one 102a of the stable ionic sites to the other stable ionic site 102b. Thus, the molecular polarization is frozen. When an electric field is applied at such a temperature, ion movement in the molecule is induced so that the molecular polarization can be reversed and a molecular polarization direction can be held even when the electric field is cut off. Thus, the single-molecule electret shows, with a single molecule, ferroelectric properties and behavior.

In a high temperature range, the included metal ion M can move, with the thermal energy exceeding the activation energy, from one stable ionic site 102a to the other stable ionic site 102b. Accordingly, the molecular polarization direction becomes uncertain, and a molecular assembly acts like the polarization having vanished. When an electric field is applied at such a temperature, ion movement in the molecule is induced so that the molecular polarization can be reversed. However, at the same time as the electric field being cut off or within a short period of time after the electric field has been cut off, the molecular polarization direction becomes uncertain.

When an electric field is applied to the molecular metal oxide cluster 10, the metal ion M included in the stable ionic site 102a moves to the other hollow stable ionic site 102b. The molecular polarization changes due to movement of the metal ion M between two stable ionic sites 102a, 102b. Since the cluster skeleton 100 is configured such that the continuous hole 101 is provided along the rotation axis, molecular polarization direction selectivity can be enhanced. That is, selection of a random direction can be reduced, and uniaxiality can be increased.

Figure 3:
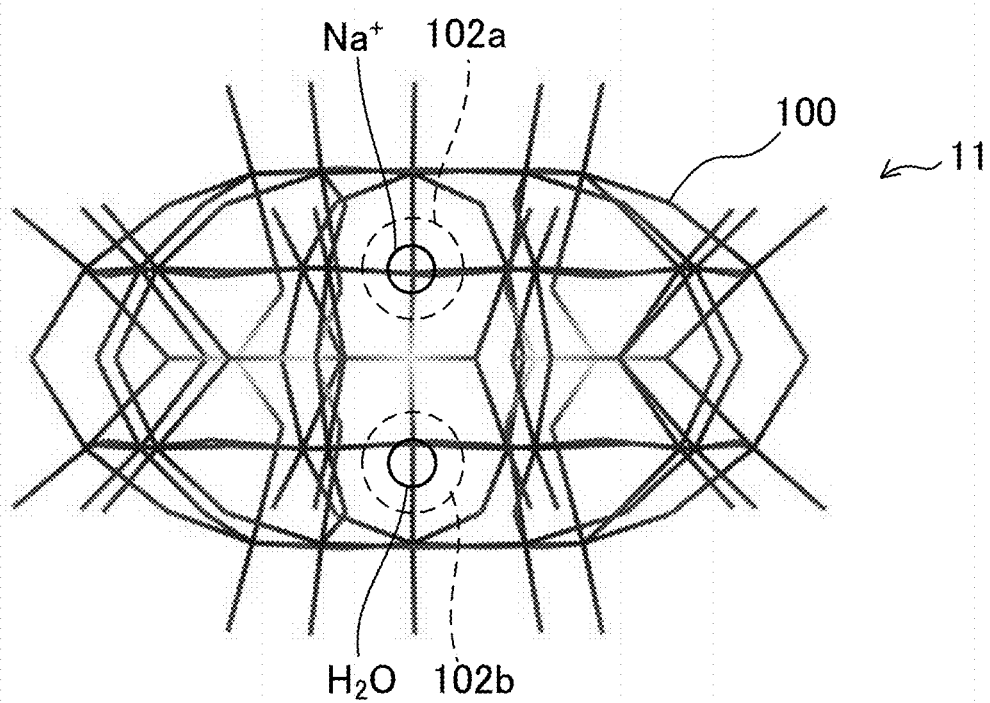
FIG. 3 is a schematic diagram of a molecular structure of a single-molecule electret according Comparative Example 1.

Comparative Example 1; Molecular Metal Oxide Cluster 11 Including Water and Sodium As a molecular metal oxide cluster reported as an example so far, a molecular metal oxide cluster 11 ($[K_{12.5}Na_{1.5}[NaP_5W_{30}O_{110}]\cdot H_2O]$) including a sodium ion and a water molecule is synthesized as a precursor. FIG. 3 shows a schematic diagram of the molecular metal oxide cluster 11 from the side. As shown in FIG. 3, the molecular metal oxide cluster 11 includes the sodium ion ($Na^+$) in one stable ionic site 102a, and includes the water molecule ($H_2O$) in the other stable ionic site 102b. The water molecule prevents the sodium ion from moving from one stable ionic site 102a to the other stable ionic site 102b, and for this reason, molecular polarization cannot be reversed by application of an external electric field in the molecular metal oxide cluster 11. Thus, the molecular metal oxide cluster 11 cannot be used as a molecule having ferroelectric properties.

Comparative Example 2; Molecular Metal Oxide Cluster Including Potassium Ion

As described in Non-Patent Document 1, in a molecular metal oxide cluster ($K_{13}[P_5W_{30}O_{110}K]$) including a potassium ion ($K^+$) as a metal ion M, the potassium ion is positioned substantially at the center between two stable ionic sites. Thus, such a molecular metal oxide cluster shows no molecular polarization. Since the molecular metal oxide cluster including potassium as the same alkali metal element as sodium shows no molecular polarization, no study has been conducted so far about utilization of a molecular metal oxide cluster including a sodium ion as a single-molecule electret.

Example 1; Molecular Metal Oxide Cluster 12 Including Terbium Ion

Patent Document 3 describes that a molecular metal oxide cluster 12 including a terbium ion ($Tb^{3+}$) as a metal ion M in a cluster skeleton 100 is, as a single-molecule electret, applicable to a non-volatile memory, but there has been no finding about the versatility thereof.
Synthesis of Molecular Metal Oxide Cluster 12

First, the molecular metal oxide cluster 11 ($K_{12.5}Na_{1.5}[NaP_5W_{30}O_{110}]H_2O$) including the sodium ion and the water molecule was synthesized by an already-reported method. Next, 3 ml of $H_2O$ was added to 36.6 mg (0.1 mmol) of $Tb(NO_3)_3 \cdot 6H_2O$, and in this manner, a first solution was prepared. Next, 12 ml of $H_2O$ was added to 1.00 g (0.121 mmol) of the molecular metal oxide cluster 11, and in this manner, a second solution was prepared and was heated to 60° C. Next, the second solution was dropped into the first solution, and in this manner, a first solution mixture was prepared. Then, the first solution mixture was held at 145° C. for 24 hours. Next, 4.00 g (53 mmol) of KCl was added to the first solution mixture cooled to a room temperature. In the above-described manner, crystal powder was obtained.

By X-ray crystallography, it was confirmed that the resultant crystal is a molecular metal oxide cluster ($[TbP_5W_{30}O_{110}]\cdot nH_2O$) including a terbium ion ($Tb^{3+}$). Note that "n" in this crystal was not able to be specified. The resultant crystal was heated at 200° C. to 250° C. as an optimal heating temperature, and in this manner, the water molecule present in the stable ionic site fully disappears. Accordingly, the molecular metal oxide cluster 12 configured such that the terbium ion ($Tb^{3+}$) is included in one stable ionic site and the other stable ionic site is hollow was obtained.

If the heating temperature is lower than 200° C., complete disappearance of the water molecule from the stable ionic site is difficult. For this reason, the above-described optimal heating temperature is such a temperature that at least water present in the stable ionic site can fully disappear. The synthesized molecular metal oxide cluster was heated at the optimal heating temperature so that the maximum spontaneous polarization value can be obtained in permittivity measurement and a measurement value can be obtained with a higher accuracy than that in a typical case.
Evaluation of Electric Field Dependency and Temperature Dependency in Association with Spontaneous Polarization For the molecular metal oxide cluster 12 obtained by the above-described method so as to include the terbium ion, a P-E hysteresis was measured using a ferroelectric tester (Precision LCII manufactured by Radiant Technologies). The powder of the molecular metal oxide cluster 12 was compressed under vacuum, and a pellet disc (an area of 1.33 $cm^2$, a film thickness of 330 μm) was produced as a measurement sample. Note that the P-E hysteresis will be referred to as a D-E hysteresis or a P-E hysteresis.

Figure 4:
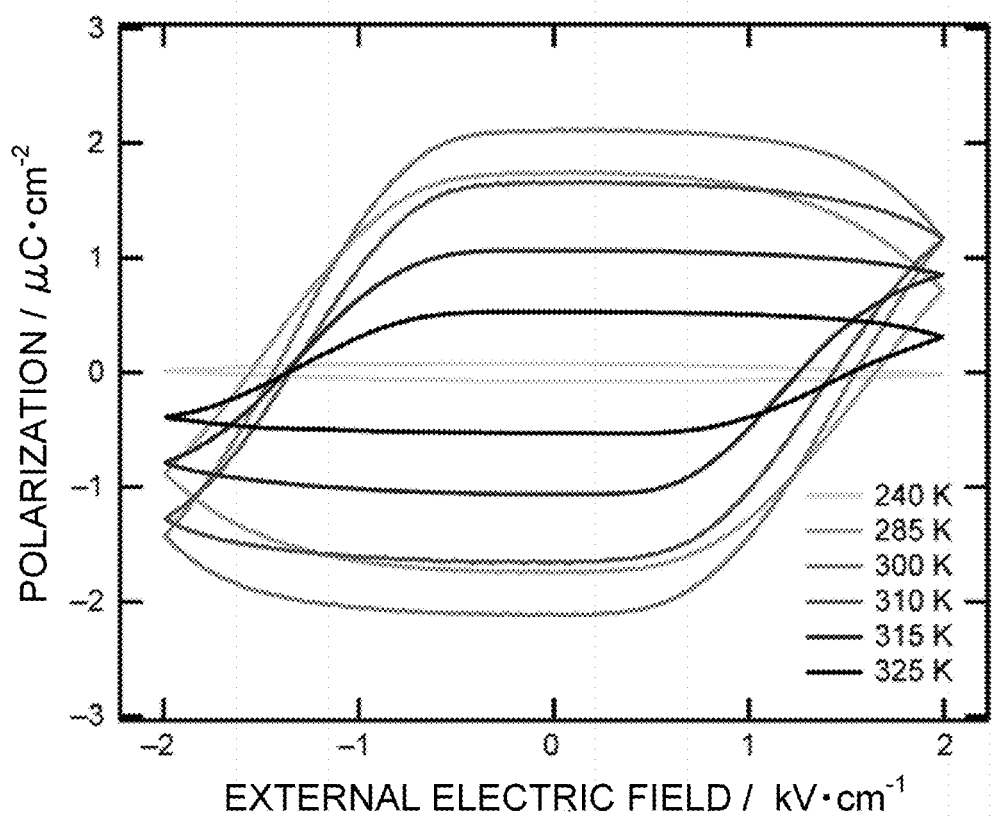
FIG. 4 is a graph showing the electric field dependency of a single-molecule electret according to Example 1 in association with the polarization thereof

FIG. 4 is a P-E hysteresis curve showing the electric field dependency of the molecular metal oxide cluster 12 according to Example 1 in association with the polarization thereof. It was confirmed that after the temperature has been increased from 240 K to 325 K, the P-E hysteresis is shown and the spontaneous polarization increases. Specifically, the P-E hysteresis gradually increased from 240 K, and the spontaneous polarization reached the maximum value at 300 K. Since the molecular metal oxide cluster 12 showed the P-E hysteresis, it was found that the terbium ion ($Tb^{3+}$) can move between two stable ionic sites 102a, 102b by application of an electric field and the molecular polarization is reversed by movement of the terbium ion between two stable ionic sites 102a, 102b.

Figure 5:
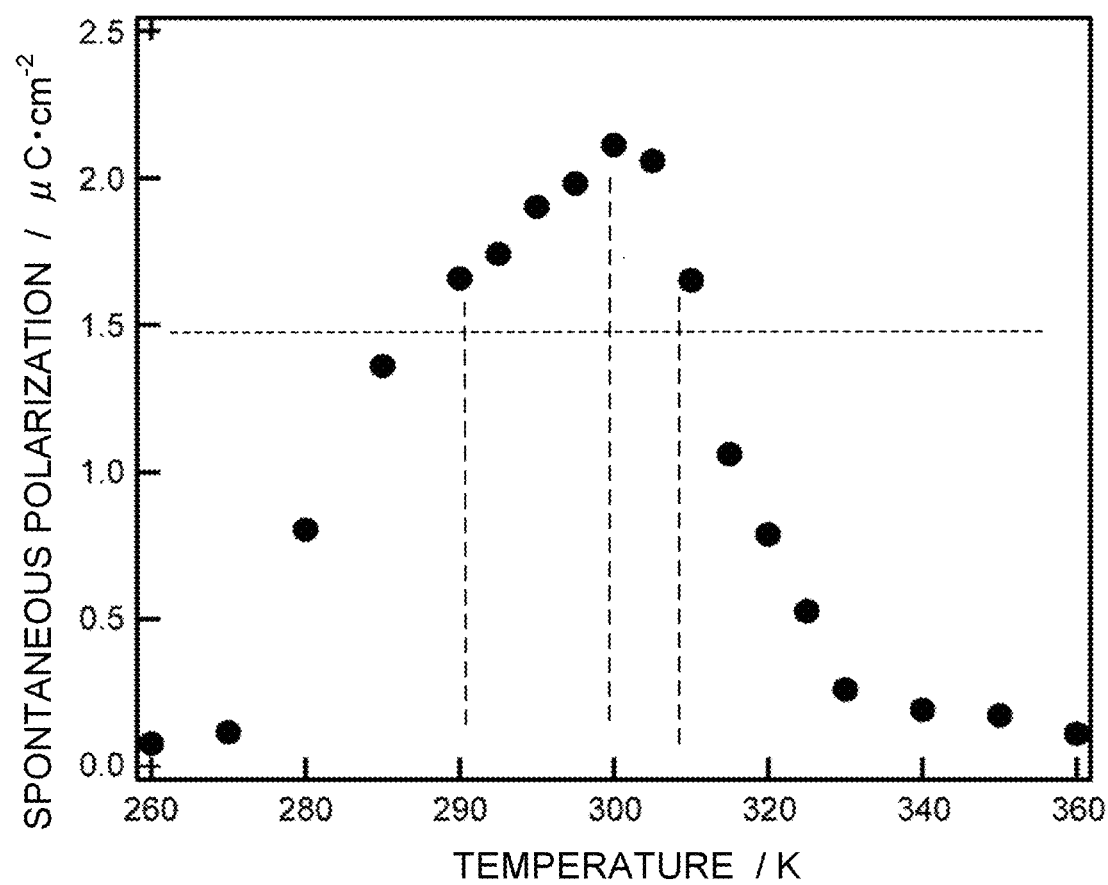
FIG. 5 is a graph showing the temperature dependency of the single-molecule electret according to Example 1 in association with the spontaneous polarization thereof.

FIG. 5 is a graph showing the temperature dependency of the molecular metal oxide cluster 12 according to Example 1 in association with the spontaneous polarization thereof. It can be confirmed that the molecular metal oxide cluster 12 shows the spontaneous polarization in a temperature range of 270 K to 330 K. Moreover, in a temperature range of about 290 K to 310 K, a spontaneous polarization of equal to or greater than 1.5 μC/$cm^2$ was shown, and the maximum spontaneous polarization value was shown at 300 K.
Evaluation of Frequency Dependency in Association with Permittivity For the resultant molecular metal oxide cluster 12, the permittivity was measured. First, a pellet (a thickness of 0.169 μm to 0.370 μm, an area of 1.46 $cm^2$ to 133 $cm^2$) was produced from the powder of the molecular metal oxide cluster 12. Next, gold paste was applied to both surfaces of the pellet, and in this manner, an electrode was formed. A wire was connected to the electrode, and was further connected to an LCR meter (E4980A manufactured by Agilent). Then, voltage was applied to measure the frequency dependency and temperature dependency of the molecular metal oxide cluster 12 in association with the permittivity thereof. A measurement frequency was 150 Hz to 2.00 MHz, an applied voltage was 2.00 V, and the temperature was 100 K to 400 K.

Figure 6:
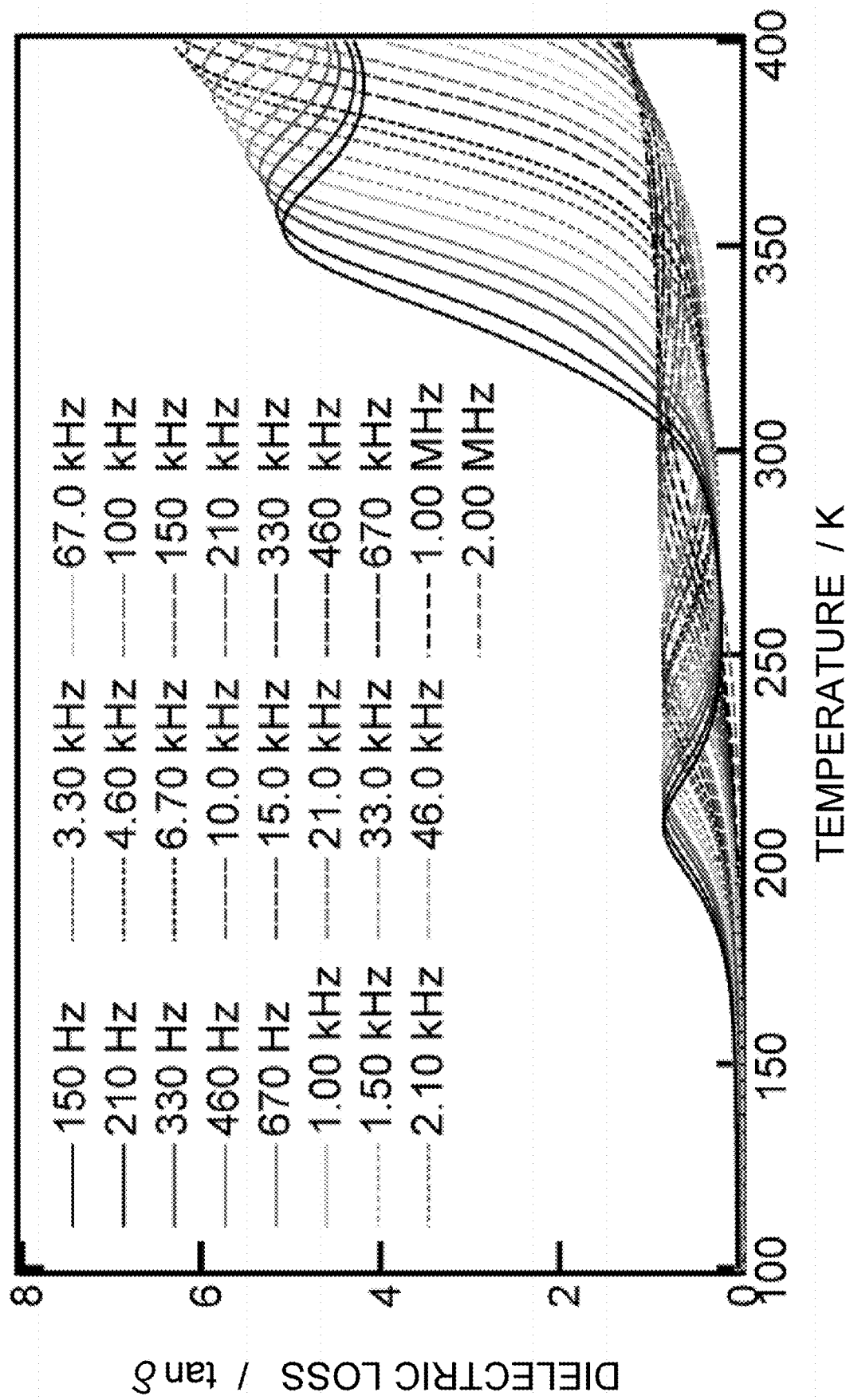
FIG. 6 is a graph showing the frequency dependency and temperature dependency of the single-molecule electret according to Example 1 in association with the permittivity thereof.

FIG. 6 is a graph showing the frequency dependency and temperature dependency of the molecular metal oxide cluster 12 according to Example 1 in association with the permittivity thereof. The ferroelectric properties and behavior of the single-molecule electret are derived from a molecular polarization relaxation phenomenon, and for this reason, there is no clear ferroelectric-induced temperature as in a typical ferroelectric material. Thus, an optional frequency taken as a frequency that an ion is substantially stopped is set, and a temperature when a polarization relaxation speed reaches such a frequency is taken as a blocking temperature or a hysteresis-induced temperature.

Figure 7:
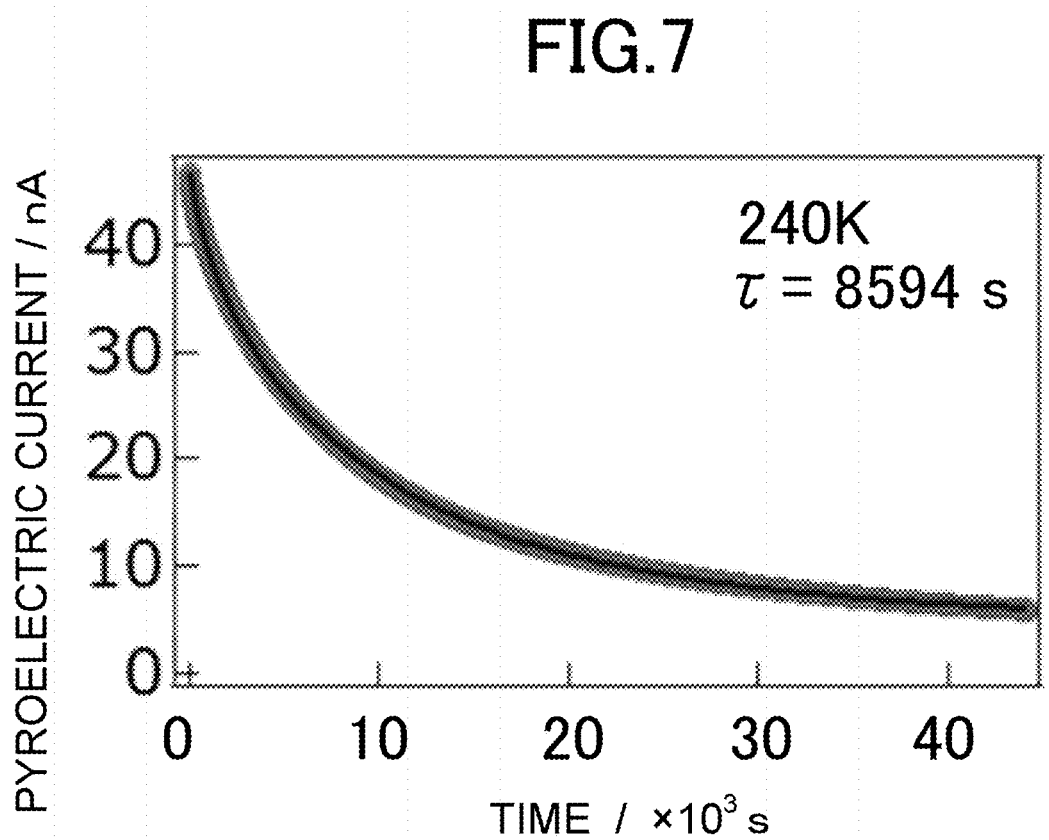
FIG. 7 is a graph showing the pyroelectric current relaxation time of the single-molecule electret according to Example 1.
Figure 8:
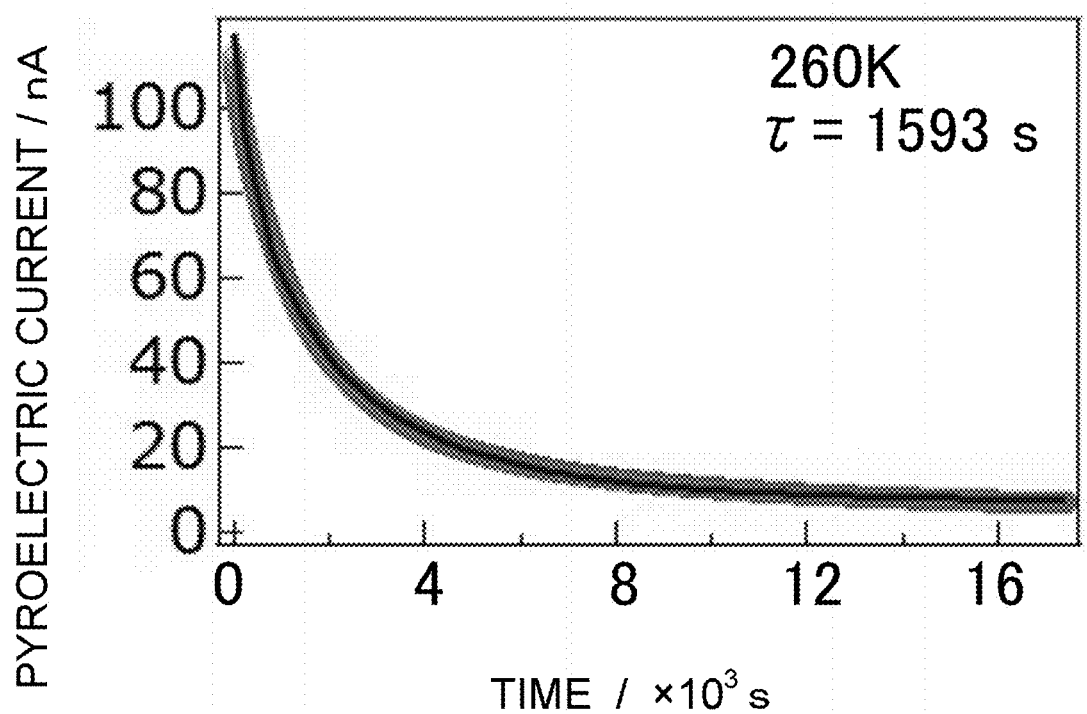
FIG. 8 is a graph showing the pyroelectric current relaxation time of the single-molecule electret according to Example 1.
Figure 9:
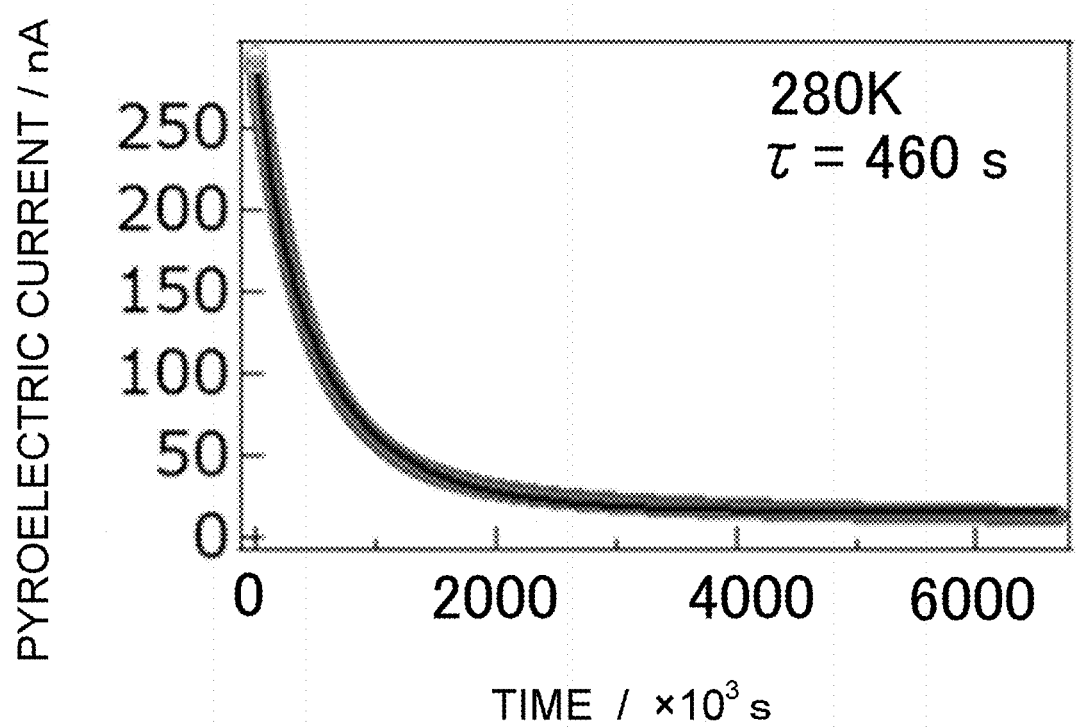
FIG. 9 is a graph showing the pyroelectric current relaxation time of the single-molecule electret according to Example 1.

As shown in FIG. 6, in a temperature range of equal to or higher than 350 K, a dielectric loss peak depending on the frequency was observed. The temperature at which such a peak is shown shifts to a lower temperature side as the frequency decreases. This shows that the terbium ion moves between the stable ionic sites 102a, 102b and the speed of movement between the stable ionic sites 102a, 102b decreases as the temperature decreases.
Evaluation by Measurement of Pyroelectric Current FIGS. 7 to 9 show graphs the pyroelectric current relaxation time of the molecular metal oxide cluster 12 including the terbium ion. FIG. 7 shows a measurement result at 240

K, and the relaxation time was 8594 seconds. FIG. 8 shows a measurement result at 260 K, and the relaxation time was 1593 seconds. FIG. 9 shows a measurement result at 280 K, and the relaxation time was 460 seconds. Note that a pyroelectric current was measured using an electrometer (6517A manufactured by Keithley Instruments, Inc.).

For the molecular metal oxide cluster 12, different relaxation times were measured according to the measurement temperature as describe above. This suggests that there is no long-range order. This result shows that when the molecular metal oxide cluster according to the present embodiment is applied to various electronic devices, different response speeds are shown under different temperatures. It is assumed that these properties are also similarly shown by molecular metal oxide clusters including sodium ions and other lanthanoid ions. Since the relaxation time can be controlled by temperature control, the molecular metal oxide cluster is useful as a non-volatile memory in a certain temperature range due to a long relaxation time, and is useful as a volatile memory in a certain temperature range due to a short relaxation time, for example. In a certain temperature range, the molecular metal oxide cluster can be also used as a storage class memory fulfilling an intermediate function between the volatile memory and the non-volatile memory.

Example 2; Molecular Metal Oxide Cluster 13 Including Sodium Ion

As shown in FIGS. 1 and 2, a molecular metal oxide cluster 13 including a sodium ion ($Na^+$) as a metal ion M in a cluster skeleton 100 includes the cluster skeleton 100 having a continuous hole 101 and two stable ionic sites 102a, 102b provided on one and the other opening end sides in the continuous hole 101 and the sodium ion ($Na^+$) included in one stable ionic site 102a. Unlike the molecular metal oxide cluster 11 according to Comparative Example 1, the molecular metal oxide cluster 13 is configured such that the other stable ionic site 102b include no water molecule. The other stable ionic site 102b is hollow.

Synthesis of Molecular Metal Oxide Cluster 13

The molecular metal oxide cluster 13 is synthesized in such a manner that the molecular metal oxide cluster 11 ($[K_{12.5}Na_{1.5}[NaP_5W_{30}O_{110}] \cdot H_2O]$) including the sodium ion and the water molecule is heated at about 300° C. as the optimal heating temperature such that the water molecule present in the other stable ionic site 102b fully disappears. Using a single crystal obtained by recrystallization of the resultant molecular metal oxide cluster 13 with water, the structure was evaluated by single-crystal X-ray crystallography. As a result, no water molecule was confirmed in the stable ionic sites 102a, 102b. Note that in the case of a low heating temperature, complete disappearance of the water molecule from the stable ionic site is difficult, and there is a probability that the water molecule returns into the stable ionic site again. It was found that no water molecule returns into the stable ionic site again even when recrystallization with water is performed as long as the water molecule fully disappears from the stable ionic site by heating at the optimal temperature.

Evaluation of Electric Field Dependency and Temperature Dependency in Association with Spontaneous Polarization For the resultant molecular metal oxide cluster 13, the P-E hysteresis was measured using the ferroelectric tester (Precision LCII manufactured by Radiant Technologies). The powder of the molecular metal oxide cluster 13 was compressed under vacuum, and a pellet disc (an area of 1.33 $cm^2$, a film thickness of 330 μm) was produced as a measurement sample.

Figure 10:
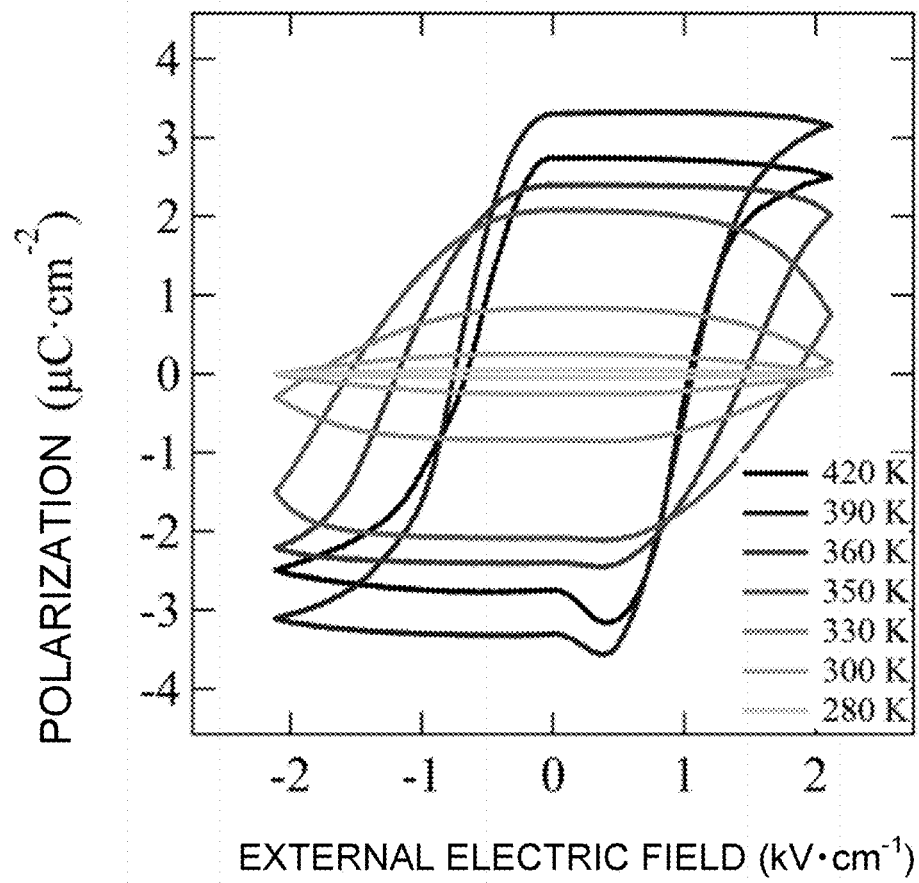
FIG. 10 is a graph showing the electric field dependency of a single-molecule electret according to Example 2 in association with the polarization thereof.

FIG. 10 is a P-E hysteresis curve showing the electric field dependency of the molecular metal oxide cluster 13 according to Example 2 in association with the polarization thereof. It was confirmed that as the temperature increases from 280 K to 420 K, the P-E hysteresis gradually increases and the spontaneous polarization increases. Specifically, there was almost no P-E hysteresis at 280 K, but the P-E hysteresis was clearly shown at 350 K. Moreover, the spontaneous polarization reached the maximum value at 390 K. Since the molecular metal oxide cluster 13 showed the P-E hysteresis, it was found that the sodium ion ($Na^+$) can move between two stable ionic sites 102a, 102b by application of an electric field and the molecular polarization is reversed by movement of the sodium ion between two stable ionic sites 102a, 102b.

Figure 11:
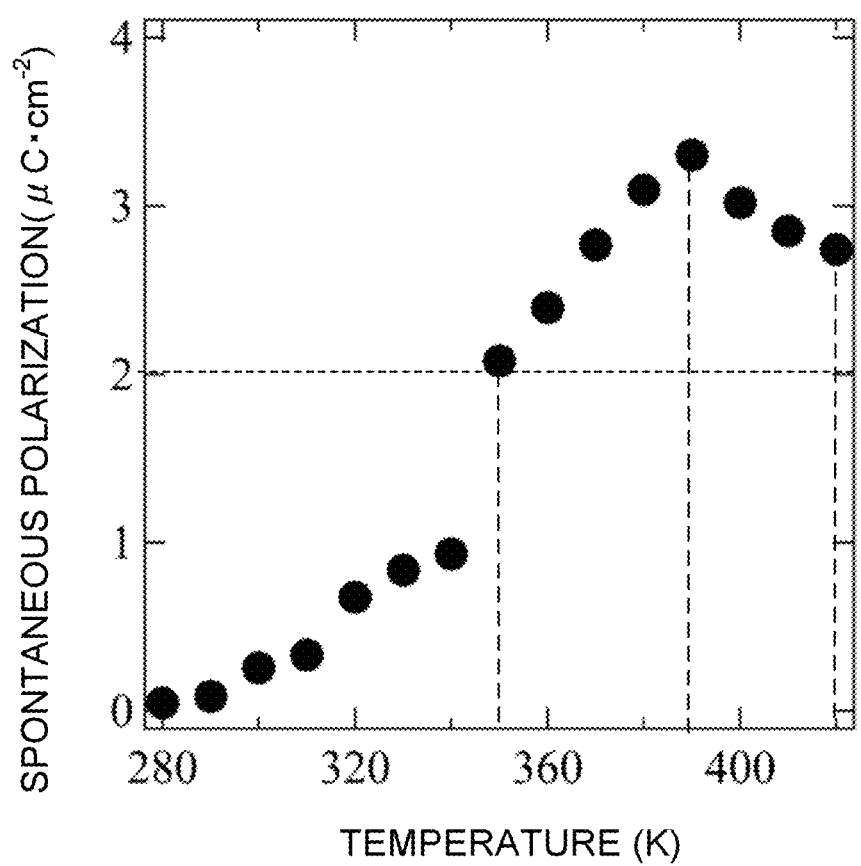
FIG. 11 is a graph showing the temperature dependency of the single-molecule electret according to Example 2 in association with the spontaneous polarization thereof.

FIG. 11 is a graph showing the temperature dependency of the molecular metal oxide cluster 13 according to Example 2 in association with the spontaneous polarization thereof. In a temperature range of 350 K to 420 K, a spontaneous polarization of equal to or greater than 2.0 μC/$cm^2$ was shown, and the maximum spontaneous polarization value was shown at 390 K. The molecular metal oxide cluster 13 according to Example 2 showed improvement in a recordkeeping temperature by about 100 K as compared to the molecular metal oxide cluster 12 including the terbium ion according to Example 1.

Molecular Metal Oxide Clusters Including Other Lanthanoid Ions

The molecular metal oxide cluster 13 including the sodium ion was successfully synthesized, and such a molecular metal oxide cluster 13 shows not only the spontaneous polarization but also the maximum spontaneous polarization value at a higher temperature than that in the typical case. Thus, it is assumed that the level of the activation energy when the metal ion M moves between the stable ionic sites 102a, 102b relates to the size of the ion radius.

For this reason, molecular metal oxide clusters 10 including, as metal ions M, lanthanoid ions ($Gd^{3+}$, $Dy^{3+}$, $Ho^{3+}$, $Er^{3+}$, $Tm^{3+}$, $Yb^{3+}$) other than a terbium ion in cluster skeletons 100 represented by a chemical formula of $P_5W_{30}O_{110}$ was synthesized, and the electric field dependency and the temperature dependency in association with the spontaneous polarization were evaluated for these molecular metal oxide clusters 10. Each molecular metal oxide cluster 10 including the metal ion M was synthesized by steps similar to those of Example 1. Table 1 shows synthesis conditions for each molecular metal oxide cluster 10 including the lanthanoid ion. Conditions other than those shown in Table 1 are similar to those of synthesis of the molecular metal oxide cluster 11 described in Example 1. Note that the number of water molecules cannot be identified in the case of using $Yb(NO_3)_3$ as a raw material, and for this reason, the number of mols is not described.

TABLE 1

| | Compound Name | mg (mmol) | Synthesis Temperature (° C.) | Synthesis Time (h) |
|---|---|---|---|---|
| $Dy^{3+}$ | $Dy(NO_3)_3 \cdot 5H_2O$ | 84.5 (0.2) | 160 | 24 |
| $Er^{3+}$ | $Er(NO_3)_3 \cdot 5H_2O$ | 88.4 (0.2) | 160 | 24 |
| $Gd^{3+}$ | $Gd(NO_3)_3 \cdot 6H_2O$ | 90.8 (0.2) | 145 | 24 |

TABLE 1-continued

| Compound Name | | mg (mmol) | Synthesis Temperature (° C.) | Synthesis Time (h) |
|---|---|---|---|---|
| $Ho^{3+}$ | $Ho(NO_3)_3 \cdot 5H_2O$ | 132.6 (0.3) | 190 | 72 |
| $Tm^{3+}$ | $Tm(NO_3)_3 \cdot 5H_2O$ | 53.5 (0.13) | 160 | 24 |
| $Yb^{3+}$ | $Yb(NO_3)_3 \cdot nH_2O$ | 89.9 (—) | 180 | 24 |

For the synthesized molecular metal oxide clusters, heating treatment was performed at the optimal heating temperature at the end. As a result of review, it was found that the range of the optimal heating temperature in the heating treatment for the molecular metal oxide cluster including the lanthanoid ion is 200° C. to 250° C. The heating treatment is performed at this optimal heating temperature so that a water molecule present in a stable ionic site can fully disappear as in Example 1.

Relationship between Ion Radius and Activation Energy

Table 2 is a table showing the radius of the metal ion M of each molecular metal oxide cluster 10 and the activation energy when the metal ion M moves between the stable ionic sites 102a, 102b.

TABLE 2

| | $E_a$ | Ion Radius (Å) |
|---|---|---|
| $Na^+$ | 1.25 | 1.02 |
| $Gd^{3+}$ | 0.99 | 0.938 |
| $Tb^{3+}$ | 0.96 | 0.923 |
| $Dy^{3+}$ | 0.95 | 0.912 |
| $Ho^{3+}$ | 0.92 | 0.901 |
| $Er^{3+}$ | 0.87 | 0.890 |
| $Tm^{3+}$ | 0.78 | 0.880 |
| $Yb^{3+}$ | 0.75 | 0.868 |

First, the permittivity was measured for each molecular metal oxide cluster. For each of molecular metal oxide clusters including a gadolinium ion ($Gd^{3+}$), a terbium ion ($Tb^{3+}$), a dysprosium ion ($Dy^{3+}$), a holmium ion ($Ho^{3+}$), an erbium ion ($Er^{3+}$), a thulium ion ($Tm^{3+}$), and an ytterbium ion ($Yb^{3+}$), the heating treatment was performed at the optimal heating temperature as in Example 1, and in this manner, permittivity measurement values were obtained with a favorable accuracy. A peak top temperature was read for each frequency from permittivity measurement results obtained as in FIG. 6, and an Arrhenius plot was produced from the inverse of such a temperature and $Ln(\omega)=2\pi f$. Note that ω indicates an angular frequency and f indicates a frequency. Note that an Arrhenius equation is the following mathematical expression and the activation energy was calculated according to this equation.

$$Ln(\omega) = -\frac{E_a}{k_B} \cdot \frac{1}{T} + Ln(\omega_0) \qquad \text{[Expression 1]}$$

Note that in the above-described mathematical expression, $E_a$ indicates an activation energy, ω indicates an angular frequency, $\omega_0$ indicates an angular frequency at an infinite temperature, $k_B$ indicates a Boltzmann constant, and T indicates a temperature.

Figure 12:
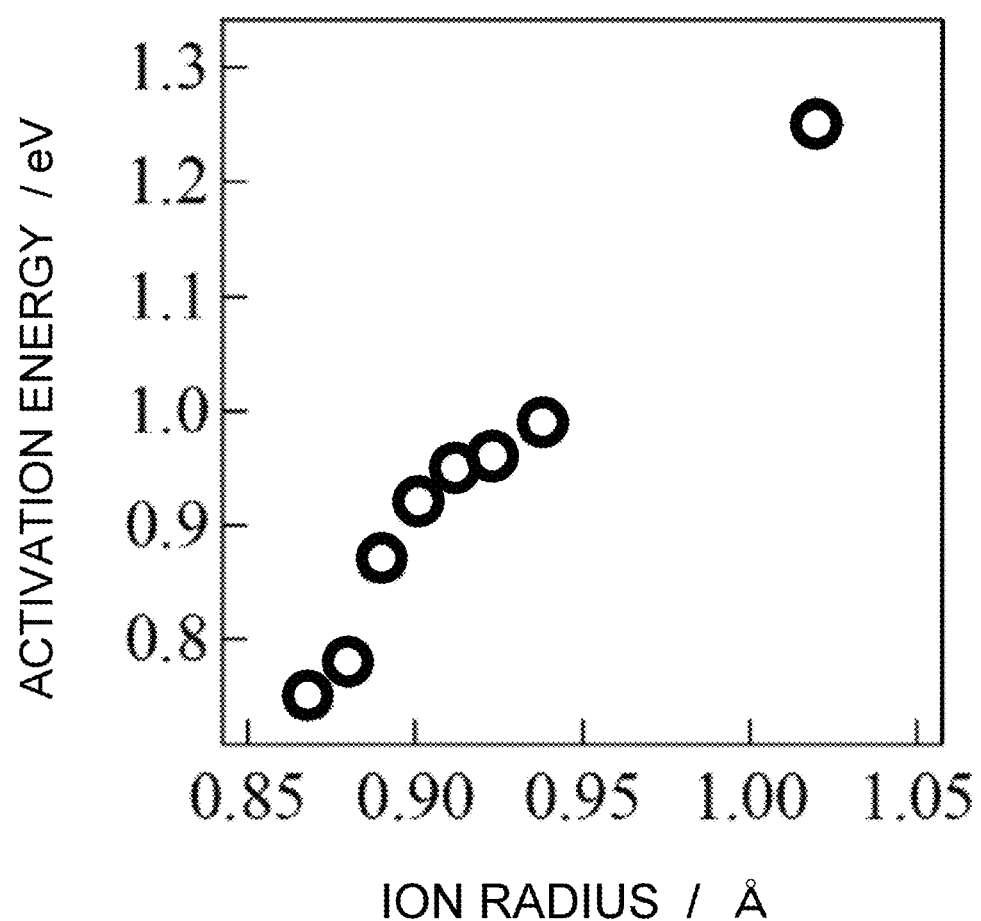
FIG. 12 is a graph showing a correlation between the ion radius of a metal ion and an activation energy when the metal ion moves between stable ionic sites.

FIG. 12 is a graph showing a correlation between the ion radius of the metal ion and the activation energy obtained by the above-described Arrhenius equation. With this graph, it was found that the activation energy when the molecular polarization of the single-molecule electret changes increases as the ion radius of the metal ion included in the molecular metal oxide cluster increases, and it was first found that there is the correlation between the ion radius and the activation energy.

The ion radius of the metal ion M included in the molecular metal oxide cluster 10 is differentiated so that the maximum temperature value that the spontaneous polarization is shown can be changed. In other words, for the molecular metal oxide cluster 10, the level of the activation energy when the metal ion M moves between the stable ionic sites 102a, 102b can be changed based on the ion radius of the metal ion M.

Note that molecular metal oxide clusters well-known so far include a molecular metal oxide cluster including a metal ion in one stable ionic site and including a water molecule in the other stable ionic site and a molecular metal oxide cluster including a metal ion in one stable ionic site and including no water molecule in the other stable ionic site. For many of these typical molecular metal oxide clusters, permittivity measurement values cannot be obtained with a favorable accuracy, and tendency due to a difference in the metal ion cannot be analyzed. It is assumed that a reason why the permittivity measurement values cannot be obtained with a favorable accuracy is that measurement samples include the molecular metal oxide clusters including the water molecules. For example, it is assumed that even when the heating treatment is performed for the molecular metal oxide cluster described in Patent Document 1 under the conditions described in Patent Document 1, the measurement value cannot be obtained with a favorable accuracy because the water molecule does not fully disappear from the other stable ionic site or returns into the other stable ionic site.

In the present embodiment, in the molecular metal oxide cluster including the lanthanoid ion in one stable ionic site, the water molecule present in the other stable ionic site fully disappears. Moreover, for the molecular metal oxide cluster including the sodium ion in one stable ionic site, the optimal heating temperature at which the water molecule present in the other stable ionic site fully disappears can be found. Moreover, the molecular metal oxide cluster subjected to the heating treatment at the optimal heating temperature can show the spontaneous polarization at a maximum, and the permittivity measurement value can be obtained with a favorable accuracy. This first leads to such a finding that there is the correlation between the ion radius and the activation energy in the present embodiment.

Relationship Between Ion Radius and Recordkeeping Time

The molecular metal oxide cluster 10 according to the present embodiment shows the spontaneous polarization. Thus, a single-molecule electret having, as a molecular structure, such a molecular metal oxide cluster 10 records a change in the molecular polarization in association with a signal of 0 or 1 so that such a single-molecule electret can be applied as a molecular memory.

In the case of including a single-molecule electret layer having, as a single-molecule electret, each of molecular metal oxide clusters 10 including a sodium ion ($Na^+$), a dysprosium ion ($Dy^{3+}$), a thulium ion ($Tm^{3+}$), and an ytterbium ion ($Yb^{3+}$), the recordkeeping time of such a single-molecule electret layer as a molecular memory was calculated using the above-described Arrhenius equation. A temperature was −100° C., −50° C., 0° C., 27° C., 50° C., or 100° C., and the recordkeeping time under each type of temperature environment was calculated. Results are shown in Table 3 and FIG. 13.

TABLE 3

| Temperature | Recordkeeping Time (s) | | | | | | Ion Radius |
|---|---|---|---|---|---|---|---|
| (° C.) | −100 | −50 | 0 | 27 | 50 | 100 | (Å) |
| $Na^+$ | $9.1 \times 10^{22}$ | $8.8 \times 10^{13}$ | $1.7 \times 10^8$ | $8.7 \times 10^5$ | $1.9 \times 10^4$ | $2.5 \times 10^1$ | 1.02 |
| $Dy^{3+}$ | $2.4 \times 10^{13}$ | $1.5 \times 10^7$ | $1.7 \times 10^3$ | $4.5 \times 10^1$ | $3.3 \times 10^0$ | $3.4 \times 10^{-2}$ | 0.912 |
| $Tm^{3+}$ | $9.6 \times 10^{10}$ | $7.3 \times 10^5$ | $4.2 \times 10^2$ | $2.1 \times 10^1$ | $2.4 \times 10^0$ | $5.5 \times 10^{-2}$ | 0.880 |
| $Yb^{3+}$ | $1.5 \times 10^{10}$ | $2.0 \times 10^5$ | $1.5 \times 10^2$ | $8.8 \times 10^0$ | $1.1 \times 10^0$ | $3.0 \times 10^{-2}$ | 0.868 |

As shown in Table 3, the molecular memories including, as the single-molecule electrets, the molecular metal oxide clusters 10 including the sodium ion ($Na^+$), the dysprosium ion ($Dy^{3+}$), the thulium ion ($Tm^{3+}$), and the ytterbium ion ($Yb^{3+}$) showed greatly-different recordkeeping temperatures according to the included metal ion. From these results, it was found that in the molecular memory including, as the single-molecule electret, the molecular metal oxide cluster according to the present embodiment, the recordkeeping time in a temperature range of −100° C. to 100° C. based on the ion radius of the metal ion is in an extremely-wide range of $3.0 \times 10^{-2}$ seconds to $9.1 \times 10^{22}$ seconds.

Figure 13:
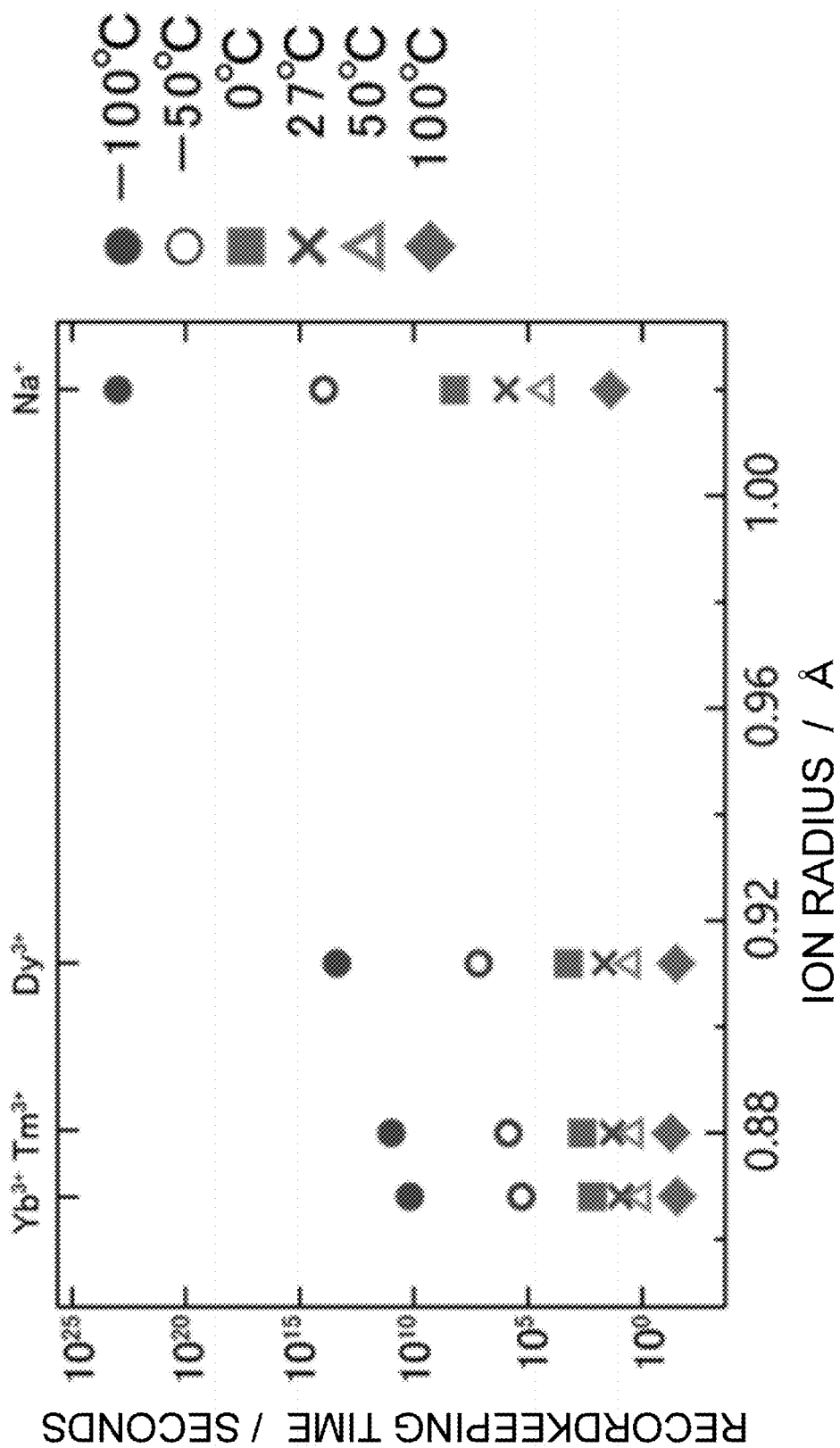
FIG. 13 is a graph showing a correlation between the ion radius of the metal ion and the recordkeeping time of a molecular memory.

Moreover, as shown in FIG. 13, it was found that the recordkeeping time increases as the ion radius of the metal ion increases and there is a correlation between the ion radius of the metal ion and the recordkeeping time of the molecular memory.

Specifically, the recordkeeping time of the molecular memory using the single-molecule electret of the present embodiment at −100° C. was in a range of $1.5 \times 10^{10}$ seconds to $9.1 \times 10^{22}$ seconds. As described above, since the molecular memory of the present embodiment has an extremely-long recordkeeping time under an environment of −100° C., such a molecular memory is suitable for a non-volatile memory.

The recordkeeping time of the molecular memory using the single-molecule electret of the present embodiment at −50° C. was in a range of $2.0 \times 10^5$ seconds to $8.8 \times 10^{13}$ seconds. Among these molecular memories, the single-molecule electret including the sodium ion ($Na^+$) has an extremely-long recordkeeping time ($8.8 \times 10^{13}$ seconds), and therefore, is suitable for a non-volatile memory. The single-molecule electrets including the dysprosium ion ($Dy^{3+}$), the thulium ion ($Tm^{3+}$), and the ytterbium ion ($Yb^{3+}$) have a relatively-long recordkeeping time of about two days to about six months, and therefore, are suitable for non-volatile memories or storage class memories.

The recordkeeping time of the molecular memory using the single-molecule electret of the present embodiment at 0° C. was in a range of $1.5 \times 10^2$ seconds to $1.7 \times 10^8$ seconds. Among these molecular memories, the single-molecule electret including the sodium ion ($Na^+$) has a long recordkeeping time (about five years), and therefore, is suitable for a non-volatile memory or a storage class memory. The single-molecule electrets including the dysprosium ion ($Dy^{3+}$), the thulium ion ($Tm^{3+}$), and the ytterbium ion ($Yb^{3+}$) have a slightly-short recordkeeping time of about three minutes to about 30 minutes, and therefore, are suitable for volatile memories or storage class memories.

The recordkeeping time of the molecular memory using the single-molecule electret of the present embodiment at 27° C. was in a range of $8.8 \times 10^0$ seconds to $8.7 \times 10^5$ seconds. Among these molecular memories, the single-molecule electret including the sodium ion ($Na^+$) has a slightly-long recordkeeping time (about 10 days), and therefore, is assumed to be suitable for a non-volatile memory or a storage class memory. The single-molecule electrets including the dysprosium ion ($Dy^{3+}$), the thulium ion ($Tm^{3+}$), and the ytterbium ion ($Yb^{3+}$) have a short recordkeeping time of about nine seconds to about eight minutes, and therefore, are suitable for volatile memories or storage class memories.

The recordkeeping time of the molecular memory using the single-molecule electret of the present embodiment at 50° C. was in a range of $1.1 \times 10^0$ seconds to $1.9 \times 10^4$ seconds. Among these molecular memories, the single-molecule electret including the sodium ion ($Na^+$) has a slightly-short recordkeeping time (about five hours), and therefore, is suitable for a non-volatile memory or a storage class memory. The single-molecule electrets including the dysprosium ion ($Dy^{3+}$), the thulium ion ($Tm^{3+}$), and the ytterbium ion ($Yb^{3+}$) have a short recordkeeping time of about one second to about three seconds, and therefore, are suitable for volatile memories or storage class memories.

The recordkeeping time of the molecular memory using the single-molecule electret of the present embodiment at 100° C. was in a range of $3.0 \times 10^{-2}$ seconds to $2.5 \times 10^1$ seconds. Among these molecular memories, the single-molecule electret including the sodium ion ($Na^+$) has a slightly-short recordkeeping time (about four minutes), and therefore, is assumed to be suitable for a non-volatile memory or a storage class memory. The single-molecule electrets including the dysprosium ion ($Dy^{3+}$), the thulium ion ($Tm^{3+}$), and the ytterbium ion ($Yb^{3+}$) have an extremely-short recordkeeping time of equal to or shorter than one second, and therefore, are suitable for volatile memories.

Note that the above-described uses of the molecular memory are merely preferred examples and are not limited to above. The molecular memories including the single-molecule electret layers having these single-molecule electrets can be used for any of a volatile memory, a non-volatile memory, and a storage class memory based on the recordkeeping time.

Control of Recordkeeping Time by Oxidation-Reduction Reaction

Next, for checking a change in the properties of the molecular memory in the case of changing an electronic state of the single-molecule electret according to the present embodiment, oxidation reaction and reduction reaction were made for the molecular metal oxide cluster 12 including terbium.

Figure 14:
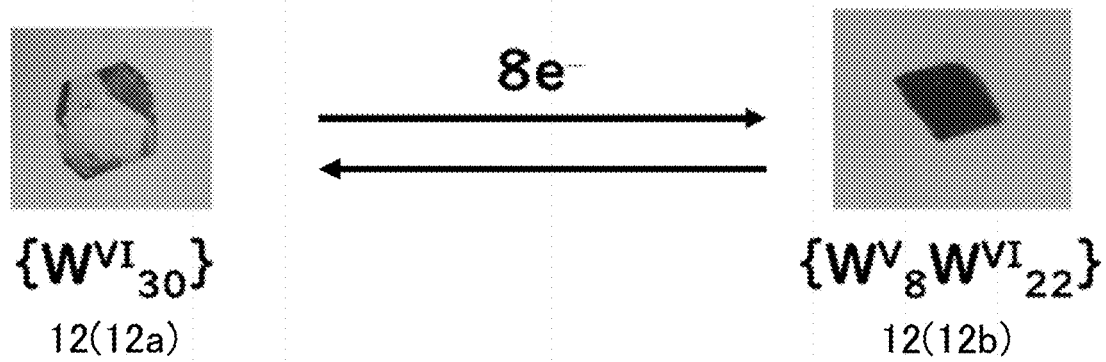
FIG. 14 is a schematic diagram showing the reduction reaction and oxidization reaction of a molecular metal oxide cluster according to Example 1.

The cluster skeleton 100 of the molecular metal oxide cluster 12 obtained by the above-described method includes 30 atoms of hexavalent tungsten (W). Of these tungsten atoms, eight atoms were reduced, and in this manner, a reduced molecular metal oxide cluster 12b having pentavalent tungsten was obtained. An original molecular metal oxide cluster of the reduced molecular metal oxide cluster 12b will be referred to as an oxidized molecular metal oxide cluster 12a. FIG. 14 shows a schematic diagram of such reaction and photographs of the molecular metal oxide clusters 12a, 12b before and after the reaction. The oxidation-reduction reaction of the molecular metal oxide cluster 12 is reversible, and the reduced molecular metal oxide cluster 12b can be changed back to the oxidized molecular metal oxide cluster 12a by the oxidation reaction. Note that the reduction reaction of the molecular metal oxide cluster 12 was made by the following steps.

Reduction Reaction of Molecular Metal Oxide Cluster 12

First, 4 ml of $H_2O$ was added to 0.1 g ($1.2\times10^{-5}$ mol) of the molecular metal oxide cluster 12, and the solution was heated to 75° C. Next, 1.38 ml ($2.8\times10^{-3}$ mol) of hydrazine monohydrate was added to the solution. After bubbling with nitrogen gas for five minutes, the solution was heated at 100° C. for 15 minutes. After heating, the solution was cooled to a room temperature. After half a day, a perse single crystal was precipitated. In the above-described manner, the reduced molecular metal oxide cluster 12b was obtained.

A single crystal of the oxidized molecular metal oxide cluster 12a was obtained in such a manner that the reduced molecular metal oxide cluster 12b stands still at a room temperature for one week or is heated at 120° C. for half a day.

Figure 15:
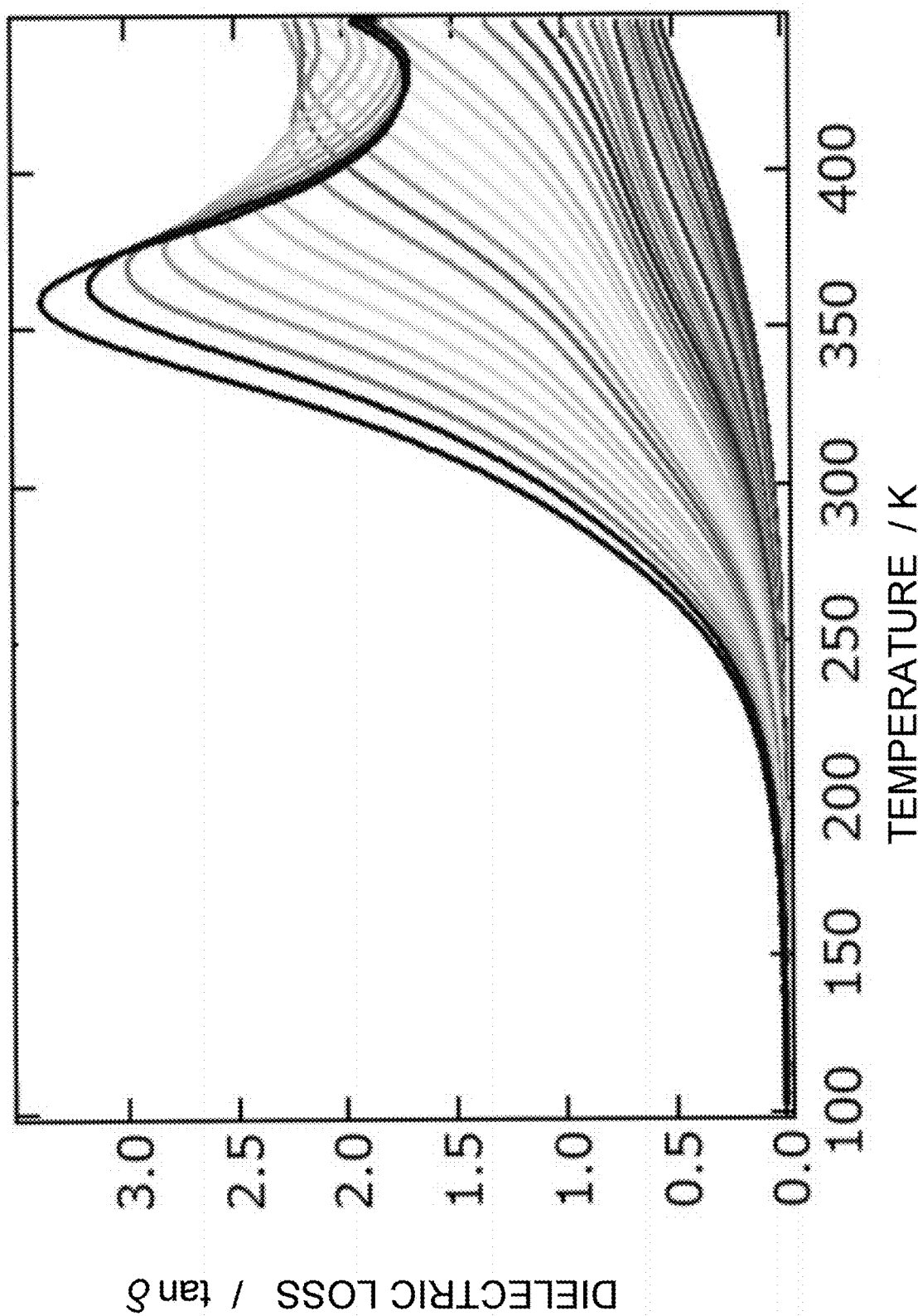
FIG. 15 is a graph showing the frequency dependency and temperature dependency of the molecular metal oxide cluster according to Example 1 in association with the permittivity thereof.

For the resultant reduced molecular metal oxide cluster 12b, the permittivity was measured by the above-described method, and the frequency dependency and the temperature dependency in association with the permittivity were checked. Results are shown in FIG. 15. The measurement results for the reduced molecular metal oxide cluster 12b shown in FIG. 15 were greatly different from the measurement results for the oxidized molecular metal oxide cluster 12a shown in FIG. 6. A temperature (the blocking temperature) when movement of the metal ion is assumed to be stopped (a movement speed of 0.1 Hz) was 286 K in the case of the oxidized molecular metal oxide cluster 12a and 254 K in the case of the reduced molecular metal oxide cluster 12b.

Further, for the molecular metal oxide cluster 13 including the sodium ion according to Example 2, the reduction reaction was made by a method similar to the above-described method. Eight atoms of hexavalent tungsten in the cluster skeleton 100 were reduced to pentavalent tungsten, and in this manner, a reduced molecular metal oxide cluster 13b was obtained. An original molecular metal oxide cluster of the reduced molecular metal oxide cluster 13b will be referred to as an oxidized molecular metal oxide cluster 13a. For checking the oxidization-reduction reaction properties of the molecular metal oxide cluster 13, measurement by cyclic voltammetry was performed.

Figure 16:
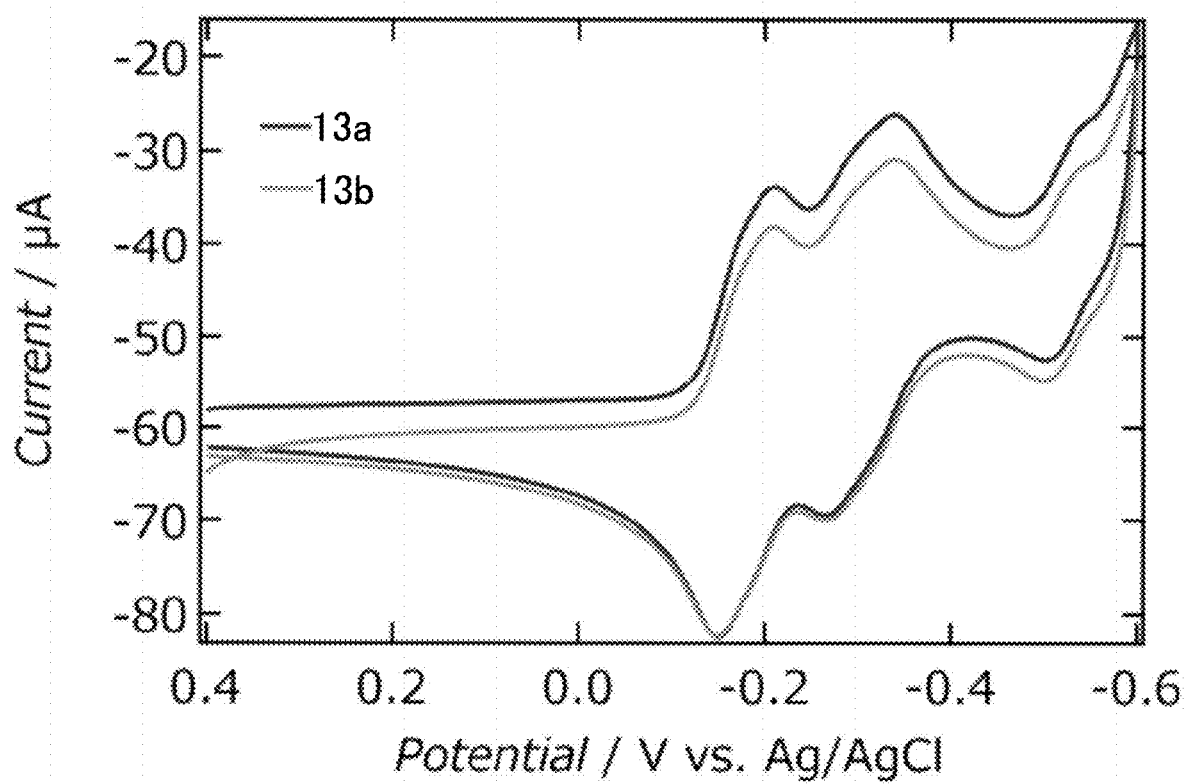
FIG. 16 is a graph showing the reversibility of the oxidization-reduction reaction of a molecular metal oxide cluster according to Example 2.

The oxidized molecular metal oxide cluster 13a and the reduced molecular metal oxide cluster 13b were adjusted such that a sample concentration in a solution is adjusted to 1 mmol/L, and were dissolved in 1 mol/L of an HCl water solution. A glass-like carbon electrode was used as a working electrode in the cyclic voltammetry, and a platinum electrode and a silver/silver chloride electrode were used as a counter electrode and a reference electrode. Results of measurement in a range of 0.6 V to +0.4 V are shown in FIG. 16. A current-potential curve of FIG. 16 showed that the oxidation-reduction reaction of the molecular metal oxide cluster 13 is reversible.

From permittivity measurement results obtained for the oxidized molecular metal oxide clusters 12a, 13a and the reduced molecular metal oxide clusters 12b, 13b, the recordkeeping time of a molecular memory including a single-molecule electret layer having each of these clusters as a single-molecule electret was calculated using the above-described Arrhenius equation. Results are shown in Table 4.

TABLE 4

|  |  | 13a | 13b | 12a | 12b |
|---|---|---|---|---|---|
| $E_a$ |  | 1.380 | 0.62 | 0.960 | 0.55 |
| $E_a/R$ |  | 16014 | 7192 | 11136 | 6380 |
| $Ln(\omega_0)$ |  | 41.543 | 24.950 | 38.474 | 24.654 |
| Ion Radius (Å) |  | 1.02 | 1.02 | 0.923 | 0.923 |
| Recordkeeping Time (second) | −100 (° C.) | $9.1 \times 10^{22}$ | $1.0 \times 10^{8}$ | $1.1 \times 10^{12}$ | $1.3 \times 10^{6}$ |
|  | −50 (° C.) | $8.8 \times 10^{13}$ | $9.3 \times 10^{3}$ | $6.0 \times 10^{5}$ | $3.3 \times 10^{2}$ |
|  | 0 (° C.) | $1.7 \times 10^{8}$ | $2.5 \times 10^{1}$ | $6.4 \times 10$ | $1.7 \times 10^{0}$ |
|  | 27 (° C.) | $8.7 \times 10^{5}$ | $2.4 \times 10^{0}$ | $1.6 \times 10^{0}$ | $2.1 \times 10^{-1}$ |
|  | 50 (° C.) | $1.9 \times 10^{4}$ | $4.3 \times 10^{-1}$ | $1.2 \times 10^{-1}$ | $4.7 \times 10^{-2}$ |
|  | 100 (° C.) | $2.5 \times 10^{1}$ | $2.2 \times 10^{-2}$ | $1.1 \times 10^{-3}$ | $3.3 \times 10^{-3}$ |

The reduced molecular metal oxide cluster 13b obtained in such a manner that the electronic state is changed by the reduction reaction of the molecular metal oxide cluster 13 including the sodium ion had a recordkeeping time of $2.4\times10^0$ seconds at 27° C. This recordkeeping time is extremely shorter than a recordkeeping time of $8.7\times10^5$ seconds (about 10 days) at 27° C. in the oxidized molecular metal oxide cluster 13a before the reduction reaction. Under other temperature conditions, the recordkeeping time greatly varied before and after the reduction reaction. For the oxidized molecular metal oxide clusters 12a, 12b including the terbium ions, results showing a great difference in the recordkeeping time were similarly obtained. From these results, it was found that by a change in the electronic state of the single-molecule electret of the present embodiment by the oxidization reaction or the reduction reaction, the molecular memory using the single-molecule electret after the reaction has a recordkeeping time different from that in the case of using the single-molecule electret before the reaction. Note that the reduction reaction of the present embodiment is made due to reduction in some atoms of the cluster skeleton and similar results are assumed to be obtained from single-molecule electrets having the same cluster skeleton or similar cluster skeletons.

Method for Manufacturing Molecular Memory with Controllable Recordkeeping Time

As described above, for the single-molecule electret of the present embodiment, the recordkeeping time is controllable according to the metal ion to be included and the temperature range. As further described above, the recordkeeping time can be significantly changed by a change in the electronic state of the single-molecule electret by the oxidization reaction or the reduction reaction. Thus, the single-molecule electret according to the embodiment of the present invention is, as a molecular memory including a single-molecule electret layer having such a single-molecule electret and recording the molecular polarization of the single-molecule electret in association with a signal of 0 or 1, applicable to various electronic devices, and a molecular memory having a recordkeeping time suitable for an intended use can be manufactured.

The single-molecule electret used for manufacturing the molecular memory according to the embodiment of the present invention includes, as described above, the cluster skeleton having the continuous hole and the plurality of stable ionic sites provided apart from each other in the continuous hole and the metal ion included in any one of the stable ionic sites and formed movable to the other hollow stable ionic site. Moreover, the single-molecule electret shows the molecular polarization in a state in which the metal ion is included in any one of the stable ionic sites, and when an electric field is applied, the metal ion moves to the other hollow stable ionic site such that the molecular polarization is changed.

Figure 17:
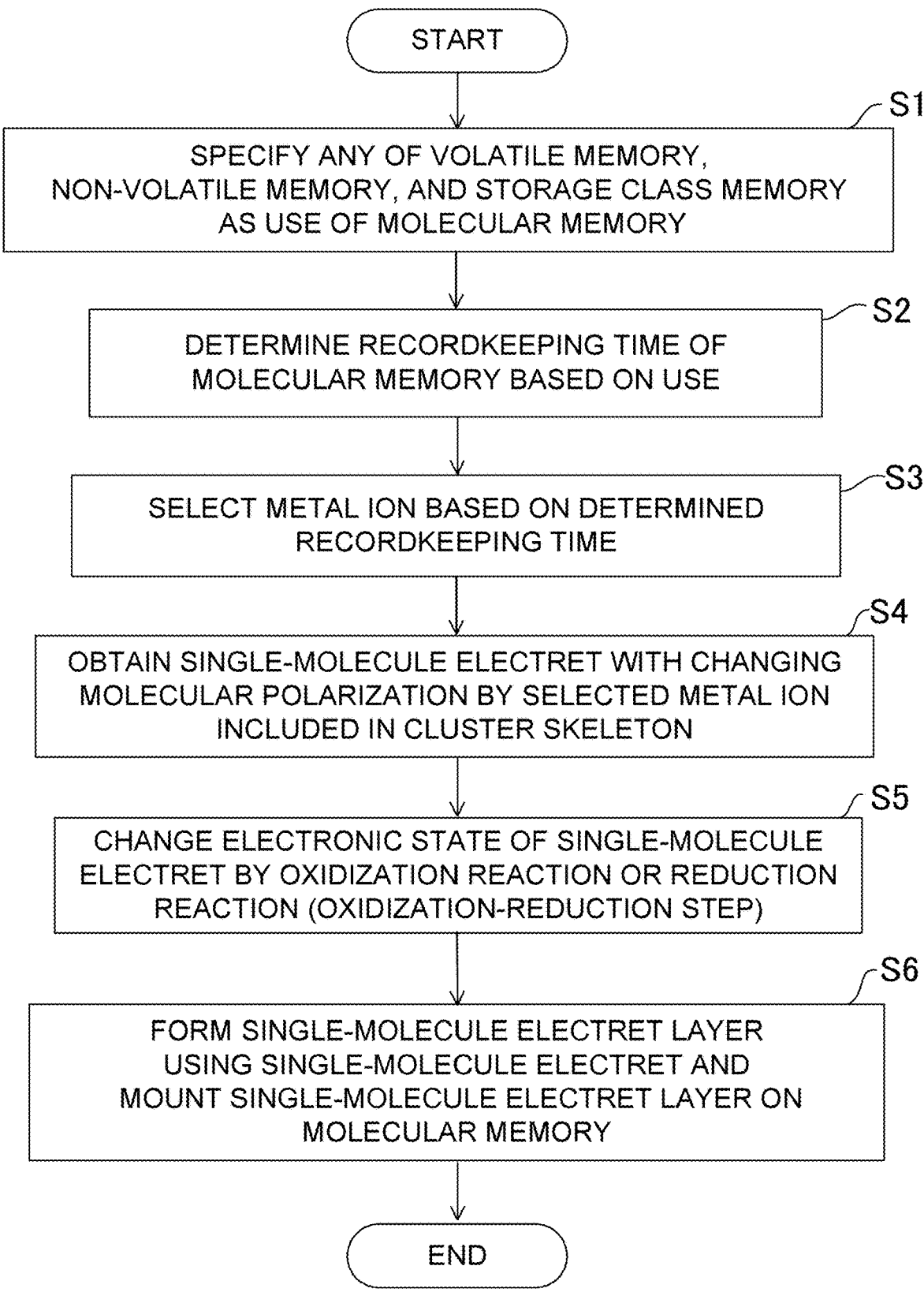
FIG. 17 is a flowchart showing the steps of the method of manufacturing the molecular memory.

The molecular memory according to the embodiment of the present invention has the controllable recordkeeping time. The method for manufacturing such a molecular memory will be described based on a flowchart shown in FIG. 17.

In Step 1 after the start, the use of the molecular memory is specified as any of a volatile memory, a storage class memory, and a non-volatile memory.

In Step 2, the approximate recordkeeping time of the molecular memory is determined based on the specified use.

In Step 3, the metal ion is selected based on the determined recordkeeping time. Note that such a recordkeeping time is a guide for selecting the metal ion and may have, e.g., a range of about one second to about 10 seconds or a range of about one month to about three months.

In Step 4, the selected metal ion is included in the cluster skeleton, and in this manner, the single-molecule electret whose molecular polarization is changeable is obtained.

Step 5 is the oxidization-reduction step of changing the recordkeeping time by changing the electronic state of the resultant single-molecule electret by the oxidization reaction or the reduction reaction.

In Step 6, the single-molecule electret layer is formed using the single-molecule electret, and is mounted on the molecular memory.

Note that Step 5 may be omitted and Step 6 may be performed next after Step 4.

For example, the single-molecule electret layer including, as the molecular structure of the single-molecule electret of the present embodiment, the molecular metal oxide cluster 10 may be mounted on a field-effect transistor. When voltage is applied to a gate electrode of the field-effect transistor, the single-molecule electret layer is polarized, and a channel region is formed. The channel region is maintained even after the power has been turned off, and therefore, such a single-molecule electret layer can be used for a non-volatile memory. Since the molecular metal oxide cluster 13 including sodium has a high activation energy when the sodium ion moves between the stable ionic sites 102a, 102b, the recordkeeping temperature can be drastically improved as compared to the typical case if the molecular metal oxide cluster 13 is, as the single-molecule electret layer, mounted on the field-effect transistor.

A volatile memory including the single-molecule electret layer having the molecular metal oxide cluster 10 as the molecular structure of the single-molecule electret of the present embodiment is also useful. In the case of mounting the single-molecule electret layer including the molecular metal oxide cluster 10 on the volatile memory, the electric field response speed of the volatile memory varies according to the ion radius of the metal ion included in the cluster skeleton. The molecular metal oxide cluster 10 including the metal ion with a relatively-small ion radius is mounted so that the electric field response speed necessary for the volatile memory can be improved.

Example 3

Next, an example where a molecular metal oxide cluster 12 including a terbium ion is applied to a volatile memory and a non-volatile memory will be described below as Example 3.

A single-molecule electret layer including the molecular metal oxide cluster 12 according to the present embodiment can record the molecular polarization of the molecular metal oxide cluster 12 in association with a signal of 0 or 1, and can be mounted on a capacitor of the volatile memory or the non-volatile memory. This single-molecule electret layer is formed between, e.g., capacitor electrodes by application of the molecular metal oxide cluster 12. The single-molecule electret layer is polarized between the electrodes, and such polarization is associated with a signal of 0 or 1. In this manner, data is recorded. The molecular metal oxide cluster 12 according to the present embodiment shows, only with one molecule, one bit as a basic information amount unit, and therefore, the capacity of a storage device can be increased.

Figure 18:
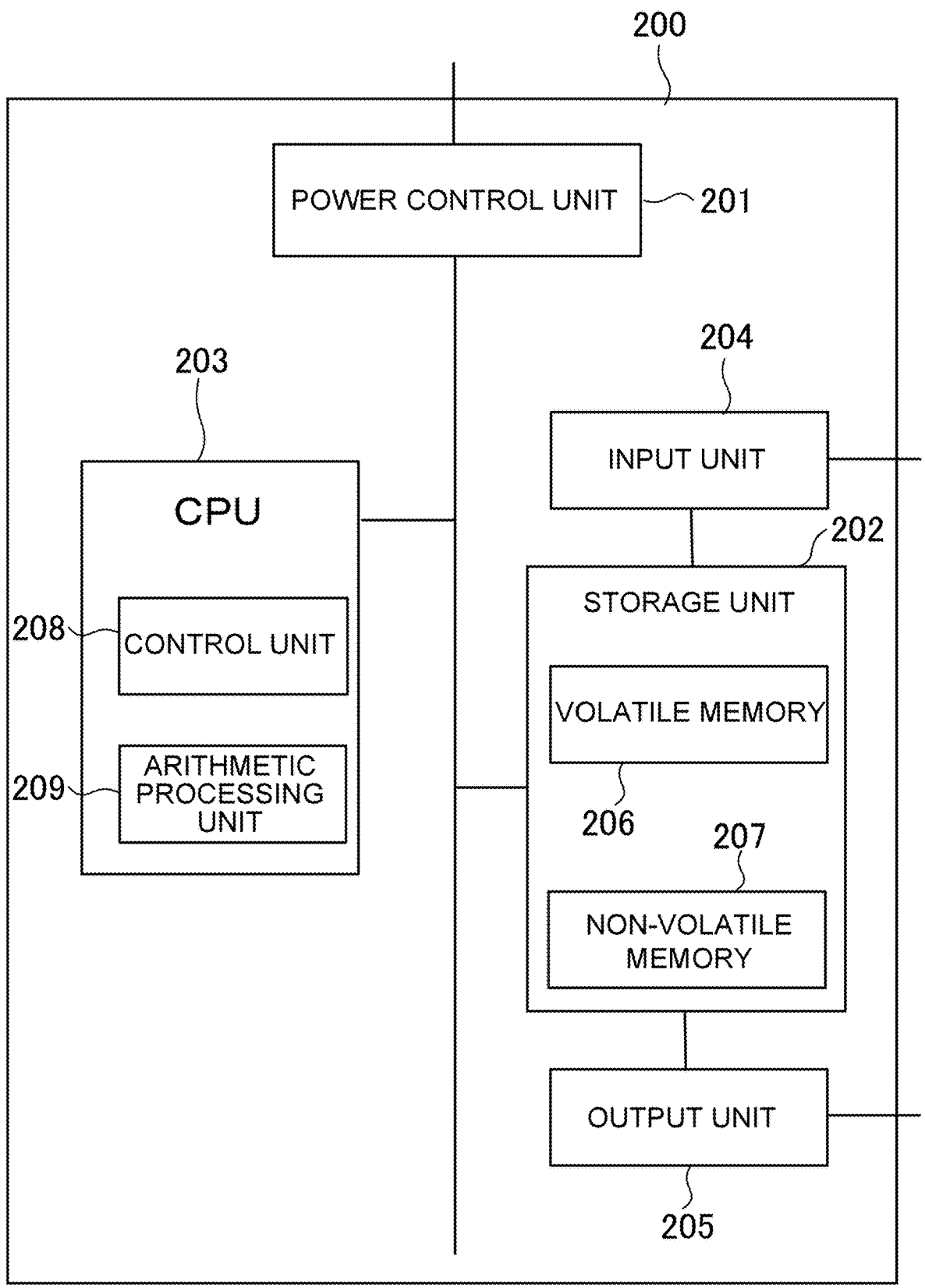
FIG. 18 is a block diagram for describing the outline of a storage device using a volatile memory and a non-volatile memory according to Example 3.

FIG. 18 is a block diagram for describing the outline of the storage device using the volatile memory and the non-volatile memory according to the present embodiment. For example, as shown in FIG. 18, the storage device 200 has a power control unit 201, a storage unit 202, a CPU 203, an input unit 204, and an output unit 205. The storage unit 202 has the non-volatile memory 207 and the volatile memory 206, and exchanges data with the outside via the input unit 204 and the output unit 205. The CPU 203 has a control unit 208 and an arithmetic processing unit 209.

The volatile memory 206 is, for example, a dynamic random access memory (DRAM). The volatile memory 206 loses the stored data over time as long as the volatile memory 206 is not refreshed by an external electric field, but has an advantage that a wiring speed and a reading speed are fast. The single-molecule electret layer including the molecular metal oxide cluster 12 according to the present embodiment is mounted on the capacitor of the volatile memory 206 so that the writing speed and the reading speed can be controlled according to the ion radius of the included metal ion.

The non-volatile memory 207 is, for example, a flash memory. The single-molecule electret layer including the molecular metal oxide cluster 12 according to the present embodiment is mounted on the capacitor of the non-volatile memory 207 so that a recordkeeping temperature can be controlled according to the ion radius of the included metal ion.

In the present embodiment, the single-molecule electret layer including the molecular metal oxide cluster is mounted on each of the volatile memory 206 and the non-volatile memory 207 to form the storage device, but is not necessarily mounted on each of the volatile memory and the non-volatile memory. Even if the single-molecule electret layer including the molecular metal oxide cluster of the present embodiment is mounted on any of the volatile memory and the non-volatile memory, the above-described advantageous effects can be obtained.

Figure 19:
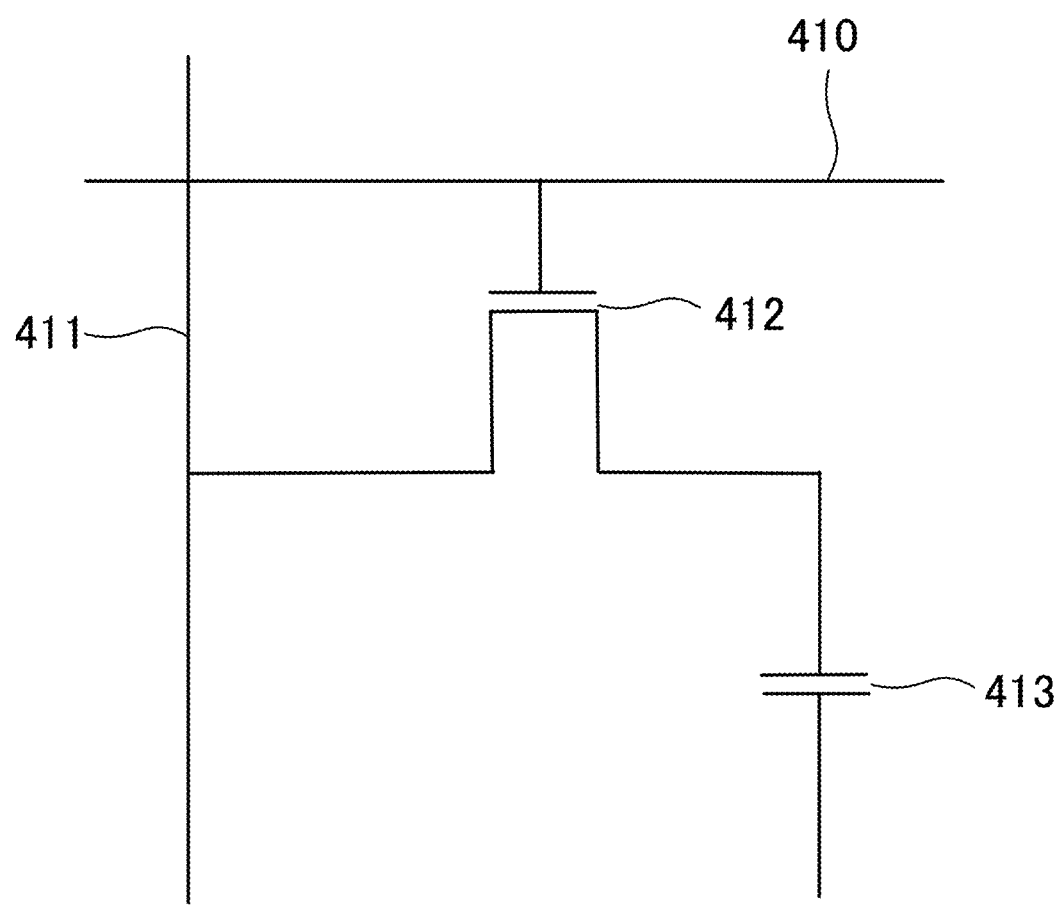
FIG. 19 is a circuit diagram showing one example of a memory cell of the volatile memory according to Example 3.

FIG. 19 is a circuit diagram showing one example of a memory cell of the volatile memory according to Example 3. Writing and Reading operation is performed in such a manner that current flows in a word line 410 and a bit line 411 arranged in a grid pattern. The memory cell has a transistor 412 and a capacitor 413 connected to the transistor 412 in series. The gate and drain of the transistor 412 are each connected to the word line 410 and the bit line 411. The capacitor 413 includes, between electrodes, the single-molecule electret layer formed of the molecular metal oxide cluster 12, and the data is written and read such that the polarization of the single-molecule electret layer is associated with a signal of 0 or 1.

Features and Effects of Examples

As described above, according to the molecular metal oxide cluster 10 of the present embodiment, when an electric field is applied, the metal ion M moves between two stable ionic sites 102a, 102b, and accordingly, the molecular polarization is reversed. The relaxation time at this point is controllable by the temperature, and therefore, the temperature control allows application to various electronic devices with different response speeds. Further, for the molecular metal oxide cluster of the present embodiment, the maximum temperature value that the spontaneous polarization is shown varies according to the ion radius of the included metal ion M. That is, the level of the activation energy upon reversal of the polarization varies according to the ion radius of the included metal ion M. Thus, by the temperature control and selection of the metal ion M to be included, the molecular metal oxide cluster of the present embodiment can exhibit excellent properties suitable for each use upon application to various electronic devices.

In the molecular memory of the present embodiment, the recordkeeping time in a temperature range of −100° C. to 100° C. based on the ion radius of the metal ion included in the stable ionic site of the cluster skeleton is an extremely-wide range of $3.0 \times 10^{-2}$ seconds to $9.1 \times 10^{22}$ seconds. Thus, based on the metal ion and the temperature environment, the recordkeeping time of the molecular memory can be controlled within an extremely-wide range. The volatile memory, the non-volatile memory, and the storage class memory each have recordkeeping times suitable therefor. Thus, the metal ion and the temperature range can be, for providing the molecular memory having the recordkeeping time suitable for the memory use, selected targeted for any of the memory uses including the volatile memory, the non-volatile memory, and the storage class memory.

In a case where the metal ion with a relatively-large ion radius is included, the recording stability and recordkeeping temperature of the non-volatile memory can be improved and the reliability of the capacitor etc. can be ensured by means of the properties that the activation energy is high upon reversal of the polarization, for example. Particularly, in a case where the included metal ion M is the sodium ion, a spontaneous polarization of equal to or greater than 2.0 $\mu C/cm^2$ is shown in a temperature range of 350 K to 420 K, and the maximum spontaneous polarization value is shown at a higher temperature than that in the typical case. Thus, the molecular metal oxide cluster 13 including sodium can drastically improve the reliability of the electronic device.

In a case where the metal ion with a relatively-small ion radius is included, the response speed of an actuator can be improved and the sensitivities of various sensors can be improved by means of the properties that the activation energy is low upon reversal of the polarization, for example.

Other Molecular Structures of Single-Molecule Electret

In the above-described embodiment, the Preyssler-type polyoxometalate skeleton as shown in FIGS. 1 and 2 is used as the cluster skeleton 100, but the present invention is not limited to the cluster skeleton 100. It is suggested that in a case where the metal ion is delocalized (disorder) in the cluster skeleton, the molecular metal oxide cluster having the continuous hole and the stable ionic sites provided apart from each other in the continuous hole shows the molecular polarization as in Preyssler-type POM. It is assumed that such a molecular metal oxide cluster is, as the single-molecule electret, applicable to the molecular memory as in the above-described embodiment and shows similar properties. Note that in the present specification, delocalization indicates dynamic disorder.

FIGS. 20, 21, and 24 to 37 are schematic diagrams of a molecular metal oxide cluster having a polyoxometalate skeleton as a cluster skeleton as in Preyssler-type POM, delocalization (disorder) of a metal ion M in the cluster skeleton being confirmed. Note that for the sake of simplicity in description, FIGS. 20, 21, and 24 to 37 show a state in which the metal ion M is in any of stable ionic sites, but the metal ion M is actually delocalized (disorder) between the stable ionic sites.

Figure 20:
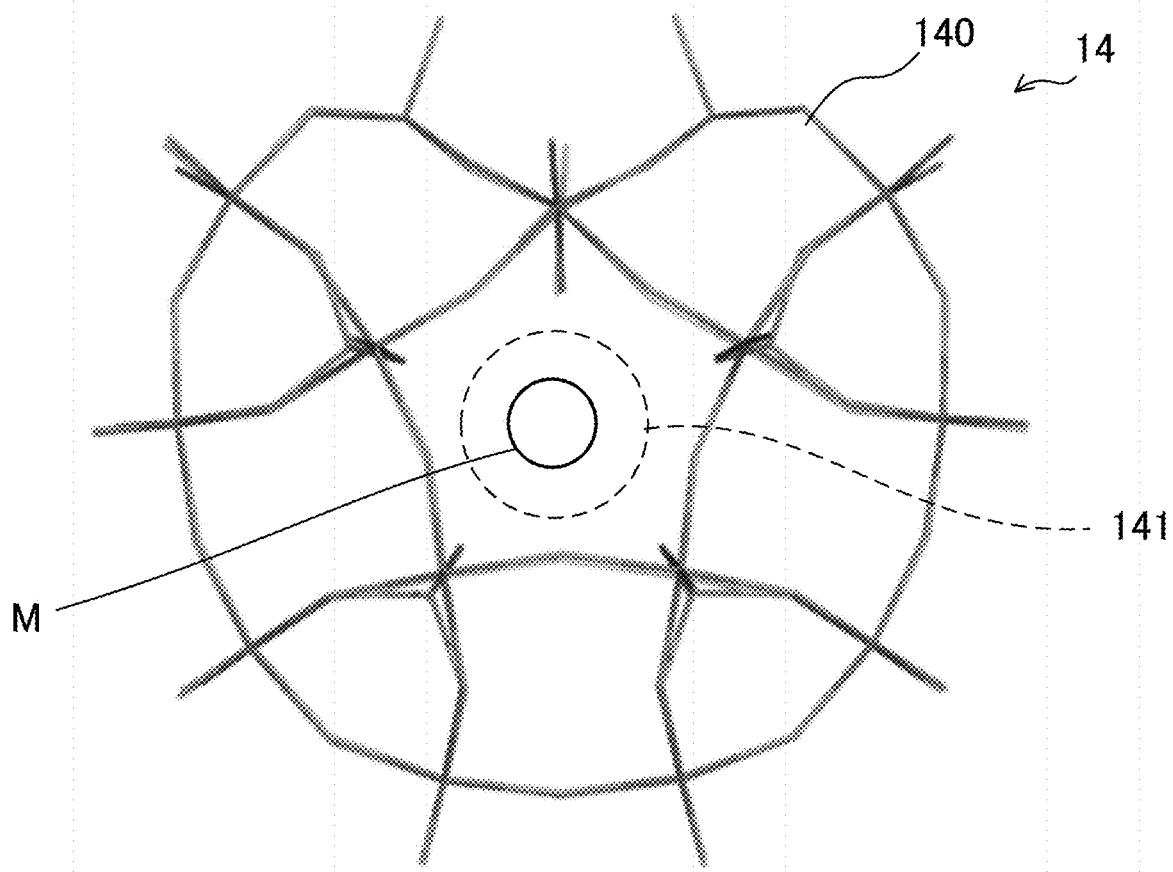
FIG. 20 is a schematic diagram showing, as viewed in plane, a molecular structure of a single-molecule electret according to Example 4.
Figure 21:
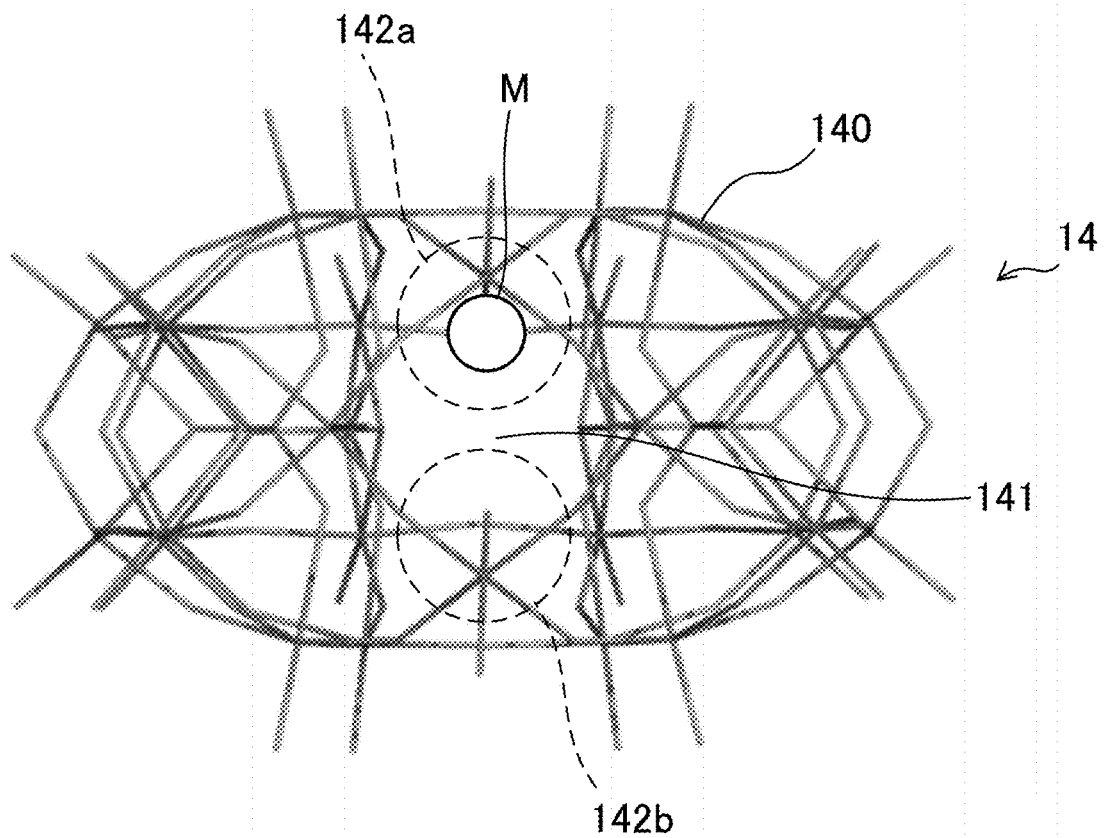
FIG. 21 is a schematic diagram showing, as viewed from the side, the molecular structure of the single-molecule electret according to Example 4.

The molecular metal oxide cluster 14 shown in FIGS. 20 and 21 has, as a cluster skeleton 140, a heart-like polyoxometalate skeleton deformed such that part of the cluster skeleton 100 is recessed. The cluster skeleton 140 is in the shape of a substantially flat spheroid formed short in an axial direction and long in a radial direction as in the above-described cluster skeleton 100, and has one continuous hole 141 extending along a rotation axis. The continuous hole 141 has stable ionic sites 142a, 142b on one and other opening end sides, and one potassium ion ($K^+$) is, as the metal ion M, included in the continuous hole 141. The chemical formula of the molecular metal oxide cluster 14 is represented by $[K^+:\{W_2CoO_8(H_2O)_2\}(P_2W_{12}O_{46})_2]^{19-}$. The potassium ion is delocalized (disorder) in the axial direction.

Synthesis of Molecular Metal Oxide Cluster 14

First, $K_{12}[H_2P_2W_{12}O_{48}] \cdot 24H_2O$ was synthesized by an already-reported method. Next, 2.0 g (0.51 mmol) of synthesized $K_{12}[H_2P_2W_{12}O_{48}] \cdot 24H_2O$ was dissolved in a water-glacial acetic acid mixture water solution (a volume ratio of 2:1), and in this manner, a first solution was prepared. Next, 6 ml of a cobalt chloride water solution (1 mol/L) and 4 ml of a sodium chloride water solution (1 mol/L) were mixed to prepare a second solution. The second solution was dropped into the first solution during stirring, and the resultant was refluxed for 10 hours. After refluxing, the first solution was cooled to a room temperature, and the crystal powder of the molecular metal oxide cluster 14 was obtained (see Zhiming Zhang, Shuang Yao, Yanfei Qi, Yangguang Li, Yonghui Wang, Enbo Wang, Dalton Transactions, 2008, 3051-3053).

Figure 22:
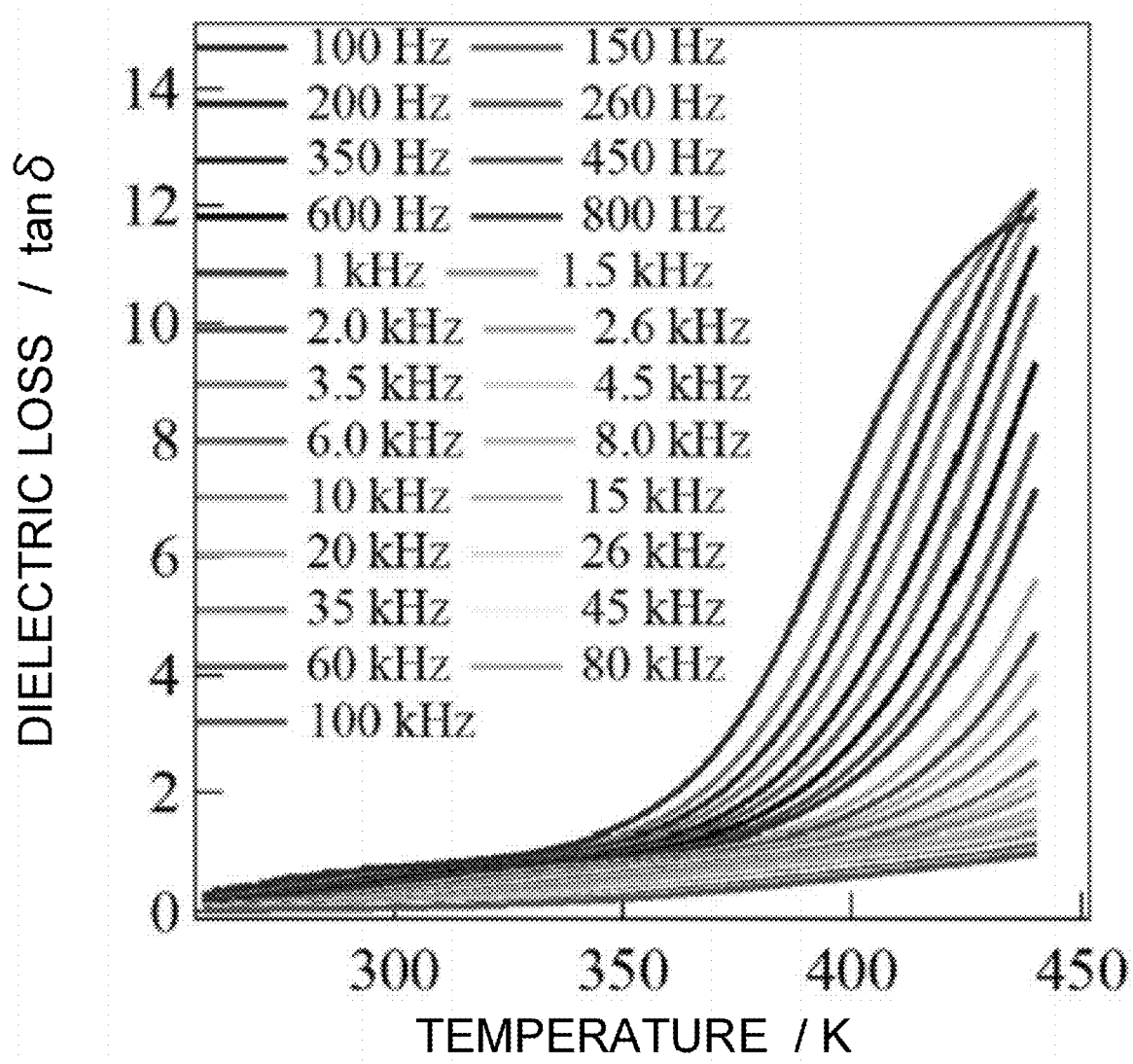
FIG. 22 is a graph showing the frequency dependency and temperature dependency of the single-molecule electret according to Example 4 in association with the permittivity thereof.

After the frequency dependency and the temperature dependency in association with the permittivity had been measured for the molecular metal oxide cluster 14, results shown in FIG. 22 were obtained. As in the molecular metal oxide cluster 12 including the terbium ion, frequency dispersion was confirmed in a low-temperature range of equal to or lower than 400 K. In a high-temperature range, a molecular polarization relaxation phenomenon was confirmed in the case of a frequency of 100 Hz. Since such a range is a higher temperature range than a measurement limit temperature, no relaxation phenomenon was confirmed in the case of other frequencies, but it is assumed that tendency similar to that of the molecular metal oxide cluster 10 is shown.

Figure 23:
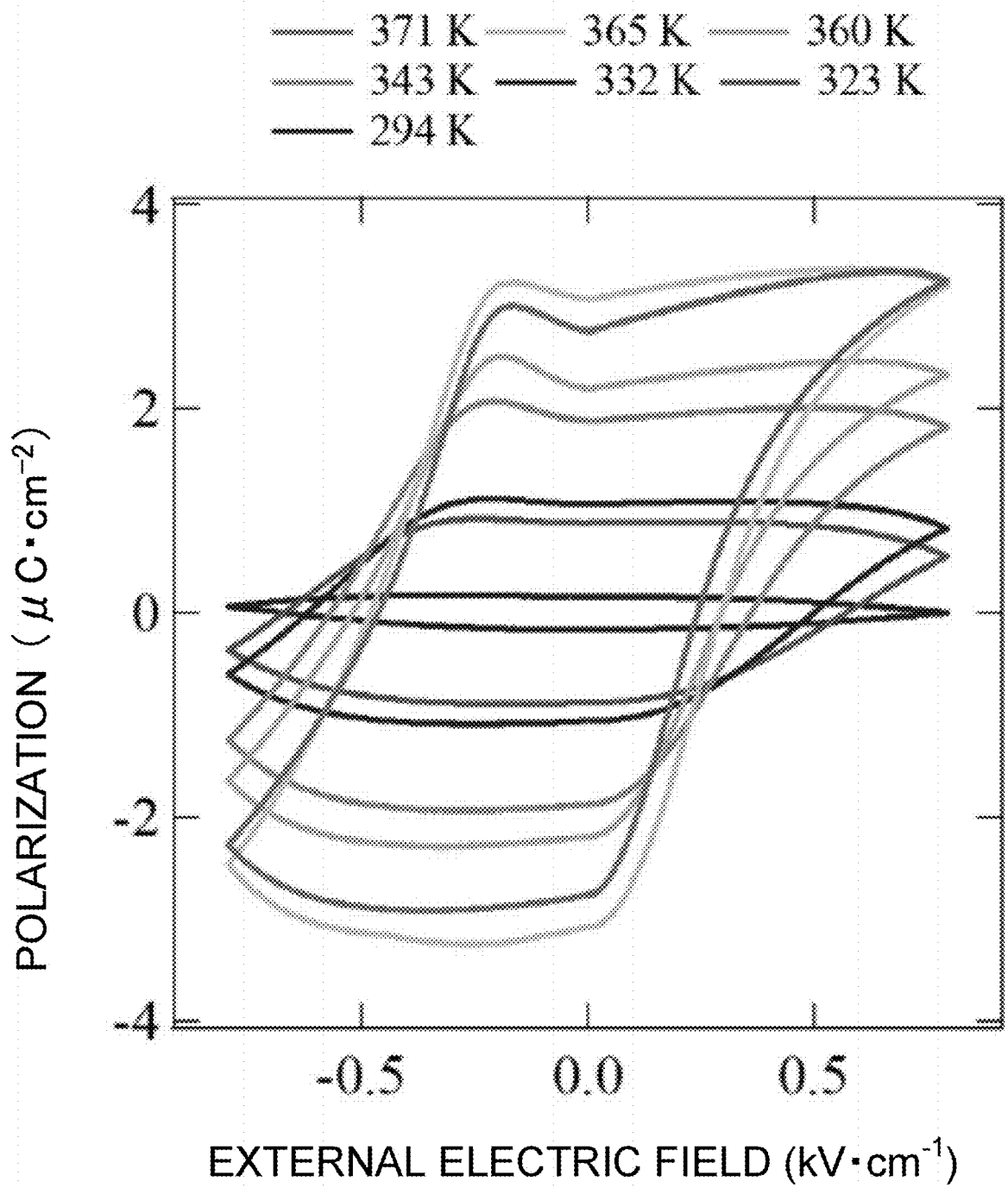
FIG. 23 is a graph showing the electric field dependency of the single-molecule electret according to Example 4 in association with the polarization thereof

For the molecular metal oxide cluster 14, a P-E hysteresis was measured. FIG. 23 is a P-E hysteresis curve showing the electric field dependency of the molecular metal oxide cluster 14 in association with the polarization thereof. After the temperature had increased from 294 K to 371 K, the P-E hysteresis was shown, and an increase in the spontaneous polarization was confirmed. Note that 365 K is the highest temperature for the spontaneous polarization. From these results, it is also assumed that the molecular metal oxide cluster 14 exhibits physical properties similar to those of the molecular metal oxide cluster 10.

Figure 24:
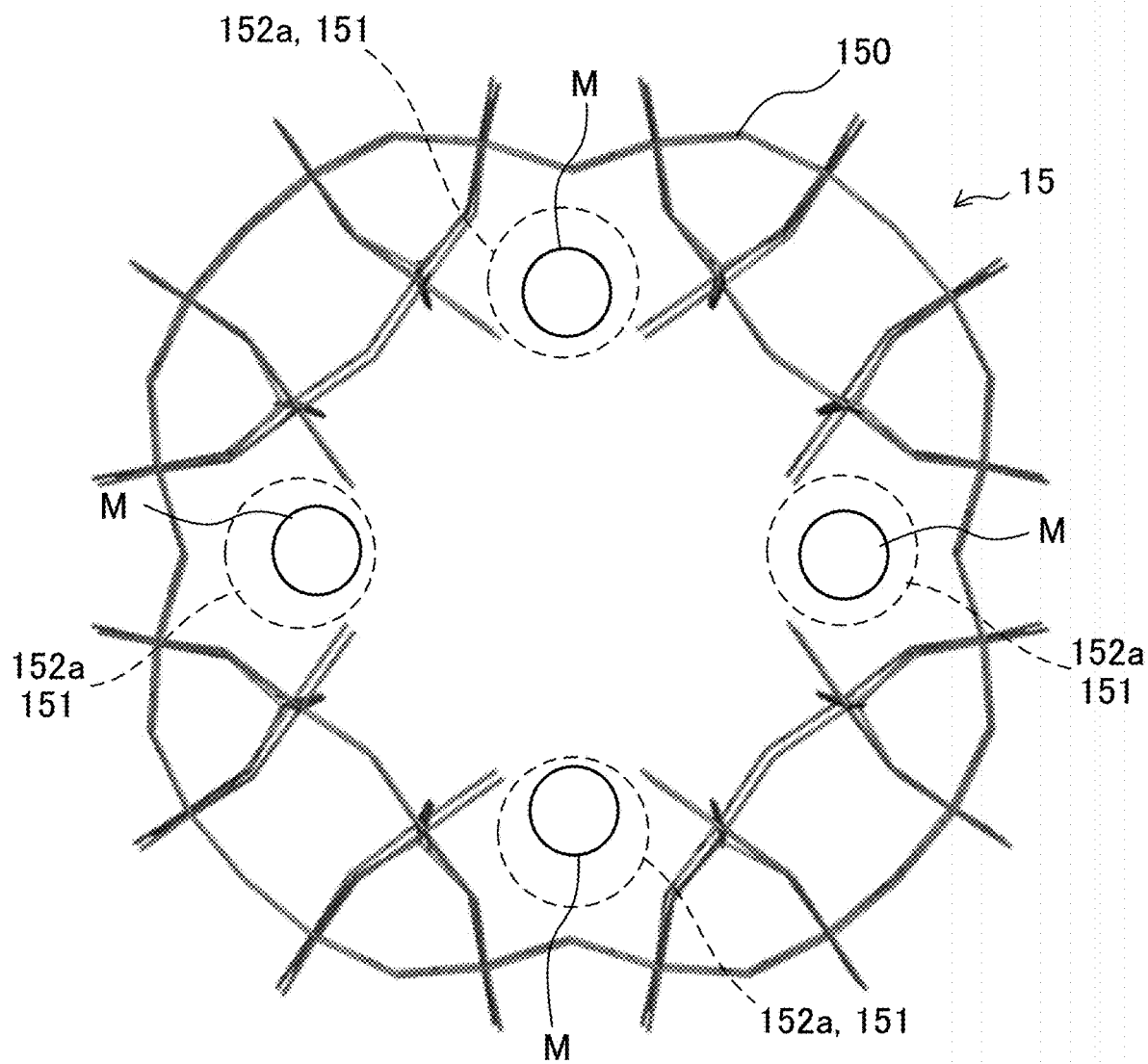
FIG. 24 is a schematic diagram showing, as viewed in plane, another example of the molecular structure of the single-molecule electret.
Figure 25:
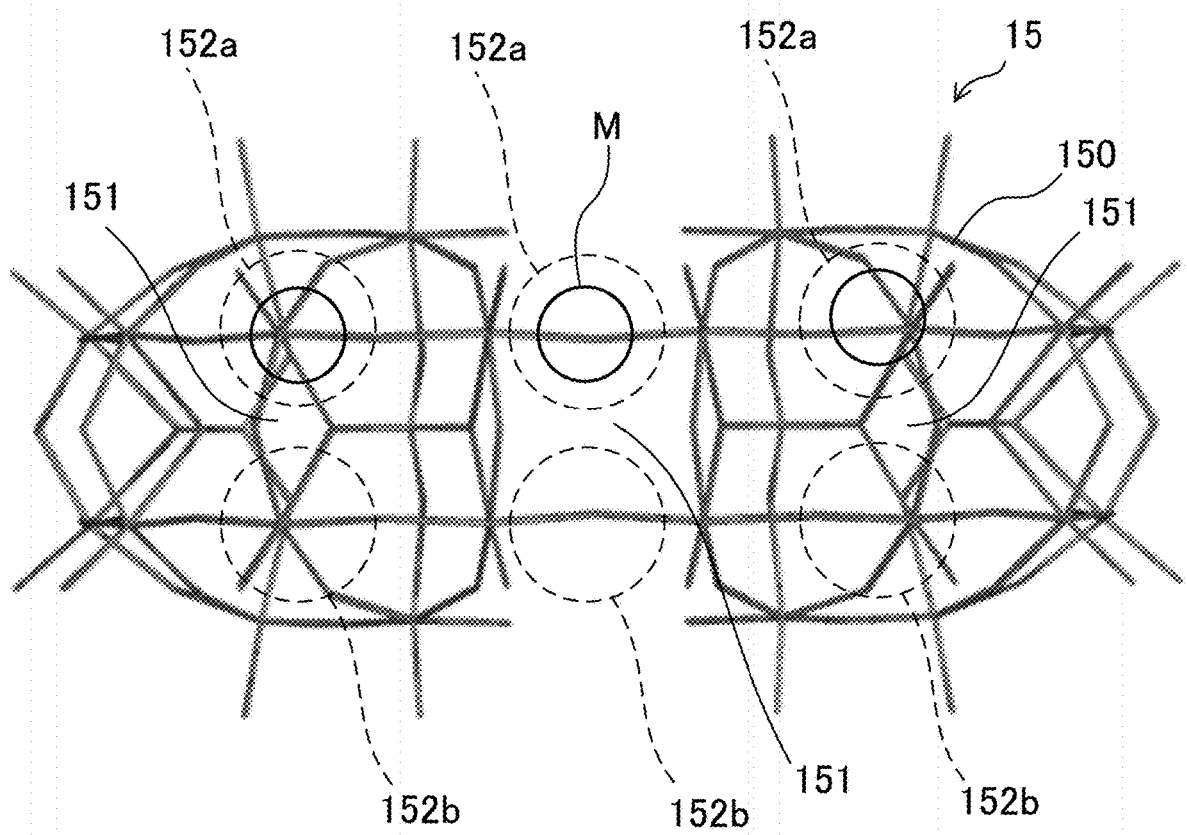
FIG. 25 is a schematic diagram showing, as viewed from the side, another example of the molecular structure of the single-molecule electret.

FIGS. 24 and 25 show a molecular metal oxide cluster 15 having, as a cluster skeleton 150, a polyoxometalate skeleton in such a shape that the above-described cluster skeleton 100 is extended in a circumferential direction. The cluster skeleton 150 includes, in the circumferential direction, four continuous holes 151 extending in a direction substantially parallel with the rotation axis of the cluster skeleton 150. Each continuous hole 151 has stable ionic sites 152a, 152b on one and the other opening end sides, and one metal ion M is included in each continuous hole 151. The chemical formula of the molecular metal oxide cluster 15 is represented by $[M^+4:H_7P_8W_{48}O_{184}]^{29-}$. Each metal ion M is delocalized (disorder) in an axial direction, and therefore, it is assumed that physical properties similar to those of the molecular metal oxide cluster 10 are exhibited.

Figure 26:
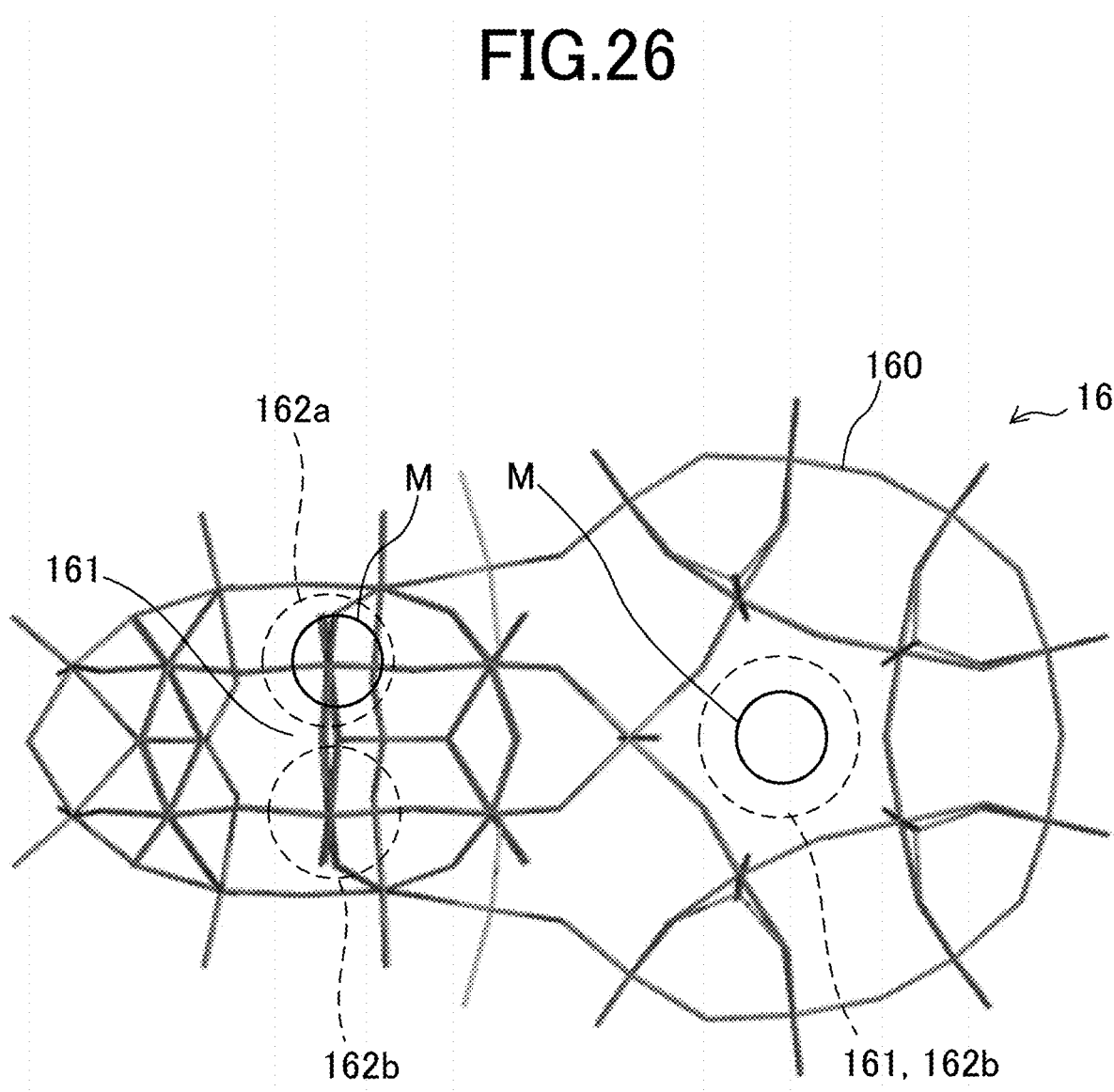
FIG. 26 is a schematic diagram showing another example of the molecular structure of the single-molecule electret.

A molecular metal oxide cluster 16 shown in FIG. 26 has, as a cluster skeleton 160, a polyoxometalate skeleton in such a shape that two cluster skeletons 100 are coupled substantially perpendicularly to each other. The cluster skeleton 160 includes two continuous holes 161 extending in directions substantially perpendicular to each other. Each continuous hole 161 has stable ionic sites 162a, 162b on one and the other opening end sides, and one metal ion M is included in each continuous hole 161. The chemical formula of the molecular metal oxide cluster 16 is represented by $[\{Sn(CH_3)_2\}4(M^+:H_2P_4W_{24}O_{92})_2]^{26-}$. The metal ion M is delocalized (disorder) in two directions substantially perpendicular to each other, and therefore, it is assumed that physical properties similar to those of the molecular metal oxide cluster 10 are exhibited.

Figure 27:
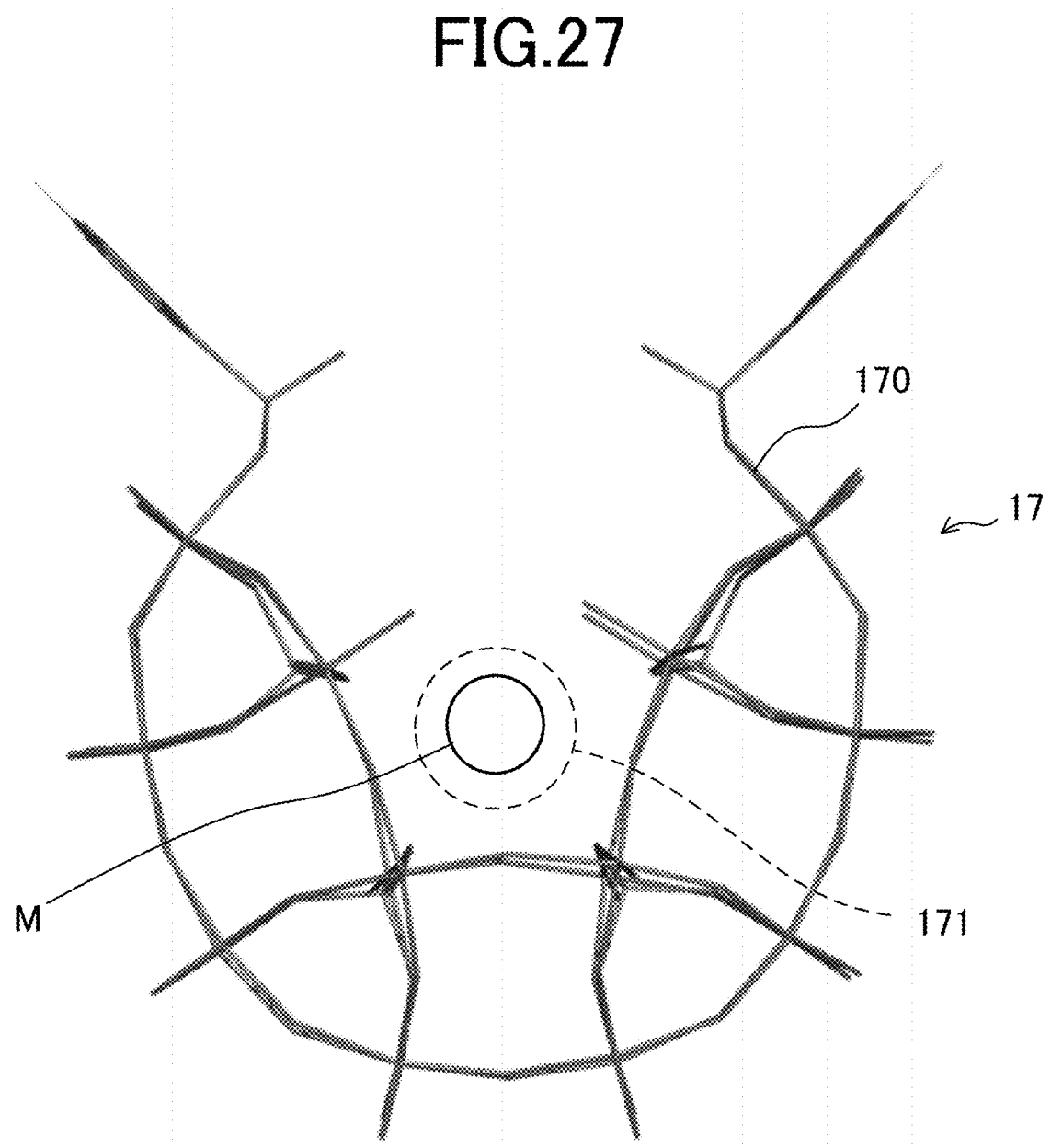
FIG. 27 is a schematic diagram showing, as viewed in plane, another example of the molecular structure of the single-molecule electret.
Figure 28:
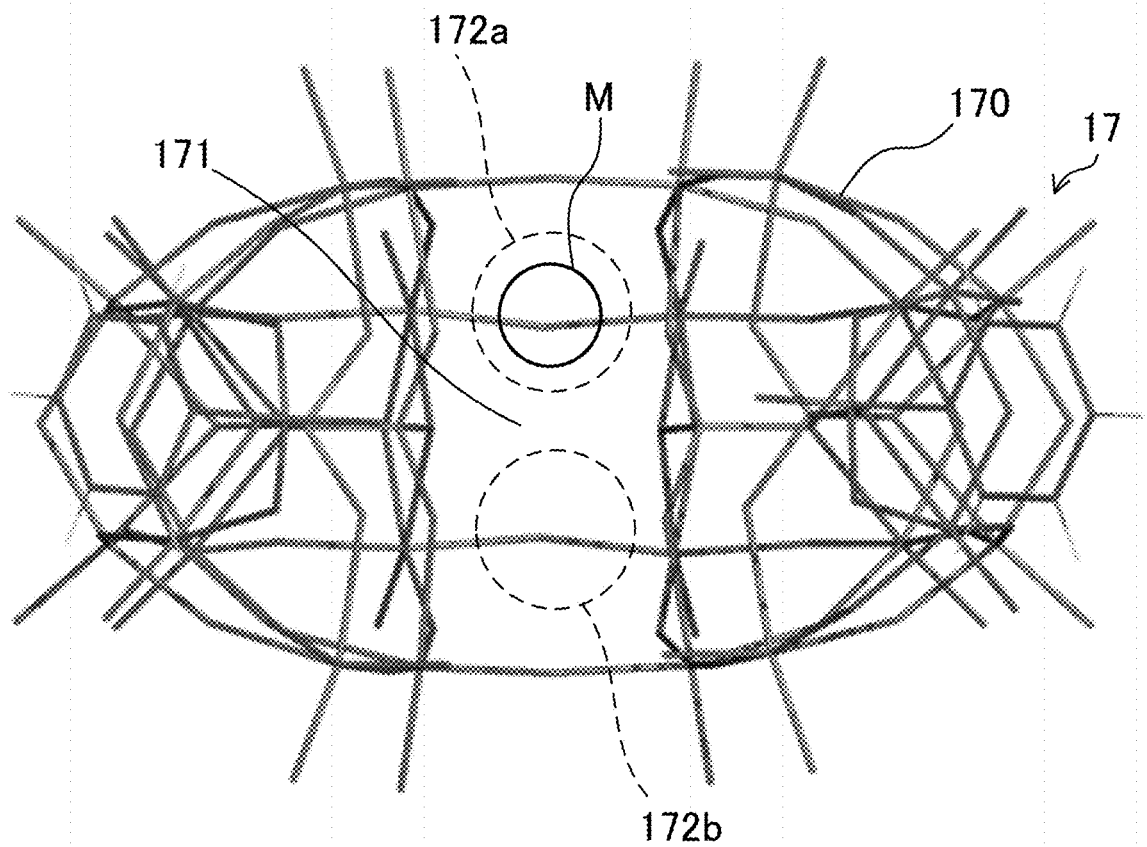
FIG. 28 is a schematic diagram showing, as viewed from the side, another example of the molecular structure of the single-molecule electret.

A molecular metal oxide cluster 17 shown in FIGS. 27 and 28 has, as a cluster skeleton 170, a polyoxometalate skeleton in such a shape that part of the cluster skeleton 100 is cleaved and a phenyl group is modified at the terminal of the cleaved cluster skeleton 100. The cluster skeleton 170 has one continuous hole 171 as in the cluster skeleton 100. The continuous hole 171 has stable ionic sites 172a, 172b on one and the other opening end sides, and one metal ion M is included in the continuous hole 171. The chemical formula of the molecular metal oxide cluster 17 is represented by $[M^+:(PhPO)_2P_4W_{24}O_{92}]^{15-}$ or $[M^+:(PhAsO)_2P_4W_{24}O_{92}]^{15-}$. The metal ion M is delocalized (disorder) in an axial direction, and therefore, it is assumed that physical properties similar to those of the molecular metal oxide cluster 10 are exhibited.

Figure 29:
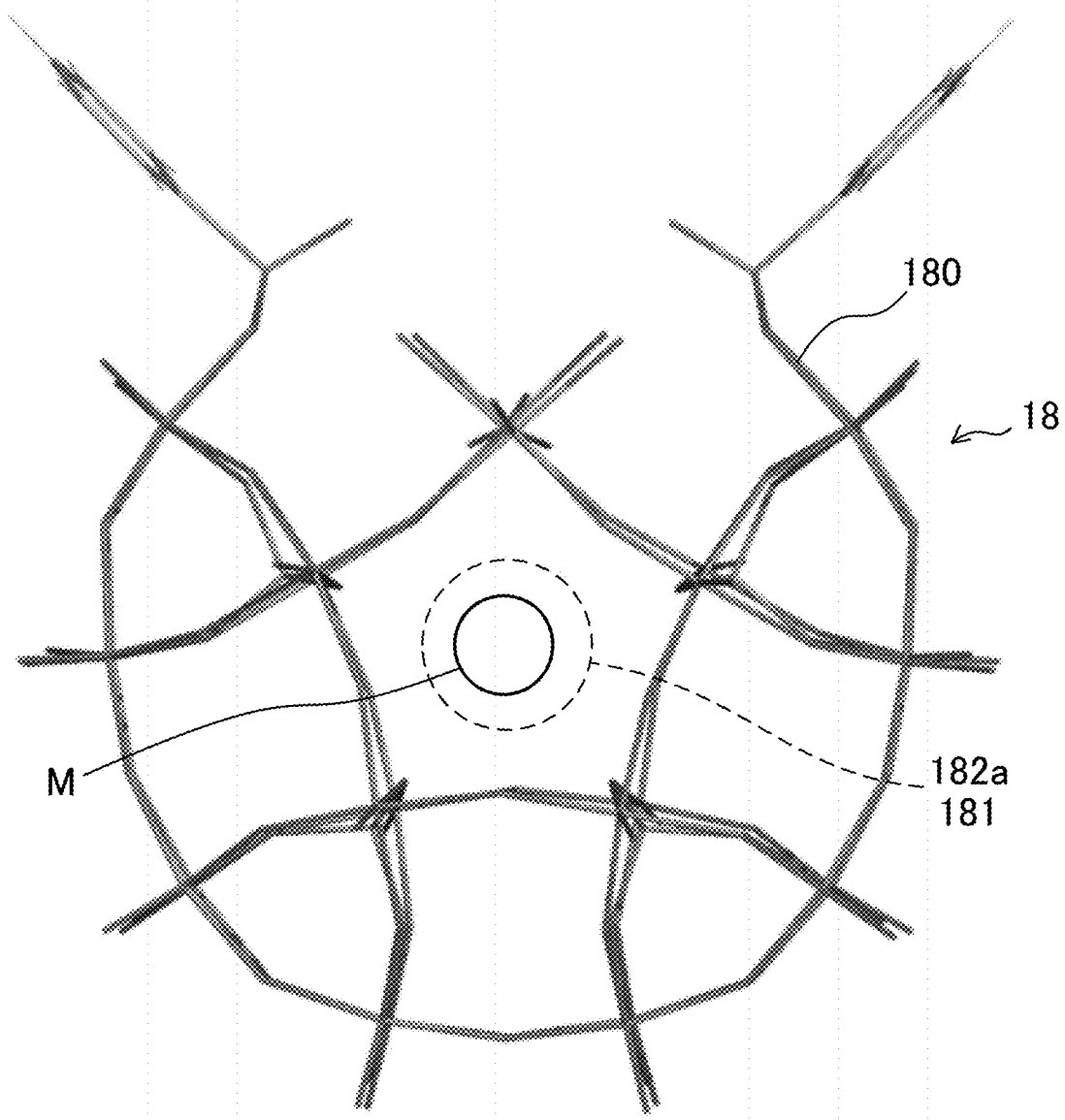
FIG. 29 is a schematic diagram showing, as viewed in plane, another example of the molecular structure of the single-molecule electret.
Figure 30:
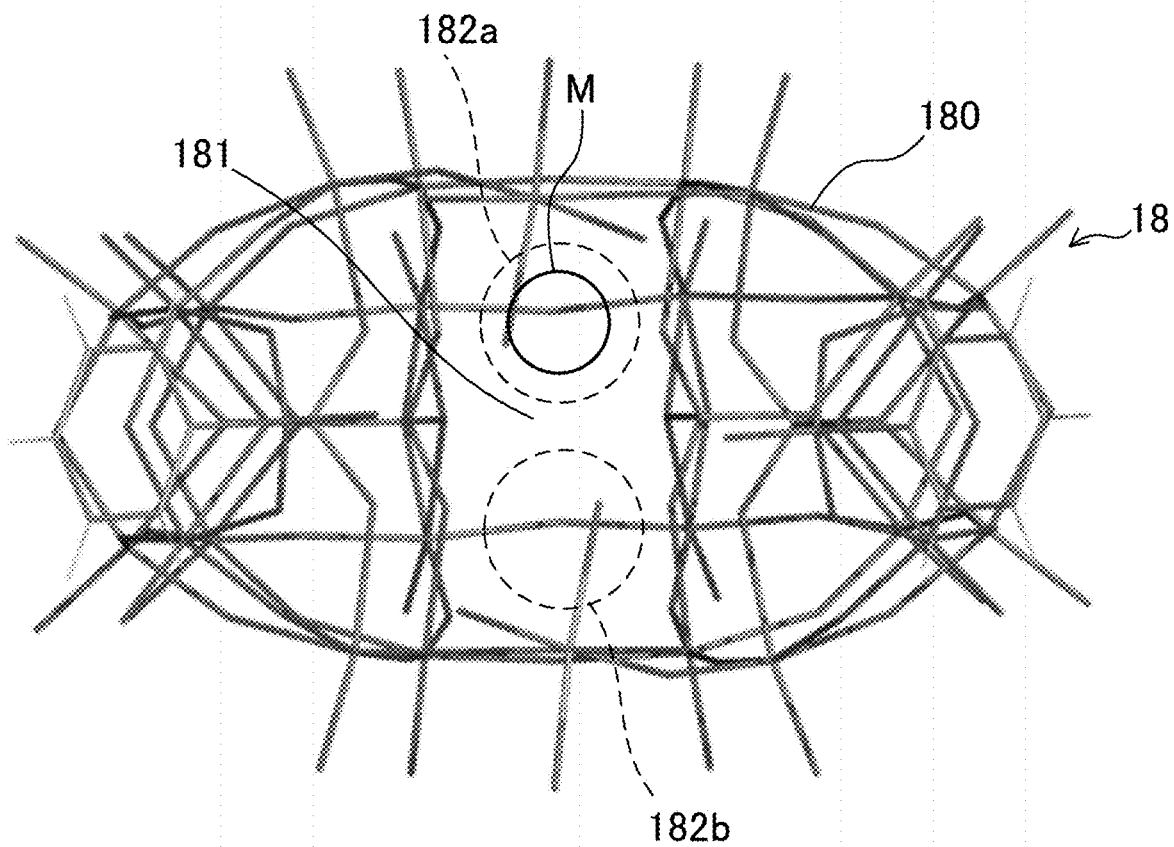
FIG. 30 is a schematic diagram showing, as viewed from the side, another example of the molecular structure of the single-molecule electret.

A molecular metal oxide cluster 18 shown in FIGS. 29 and 30 has, as a cluster skeleton 180, a polyoxometalate skeleton in such a shape that part of the cluster skeleton 100 is cleaved and a phenyl group is modified at the terminal of the cleaved cluster skeleton 100. The cluster skeleton 180 has one continuous hole 181 as in the cluster skeleton 100. The continuous hole 181 has stable ionic sites 182a, 182b on one and the other opening end sides, and one metal ion M is included in the continuous hole 181. The chemical formula of the molecular metal oxide cluster 18 is represented by $[M^+:\{Co(H_2O)_4\}_2(PhPO)_2P_4W_{24}O_{92}]^{9-}$. The metal ion M is delocalized (disorder) in an axial direction, and therefore, it is assumed that physical properties similar to those of the molecular metal oxide cluster 10 are exhibited.

Figure 31:
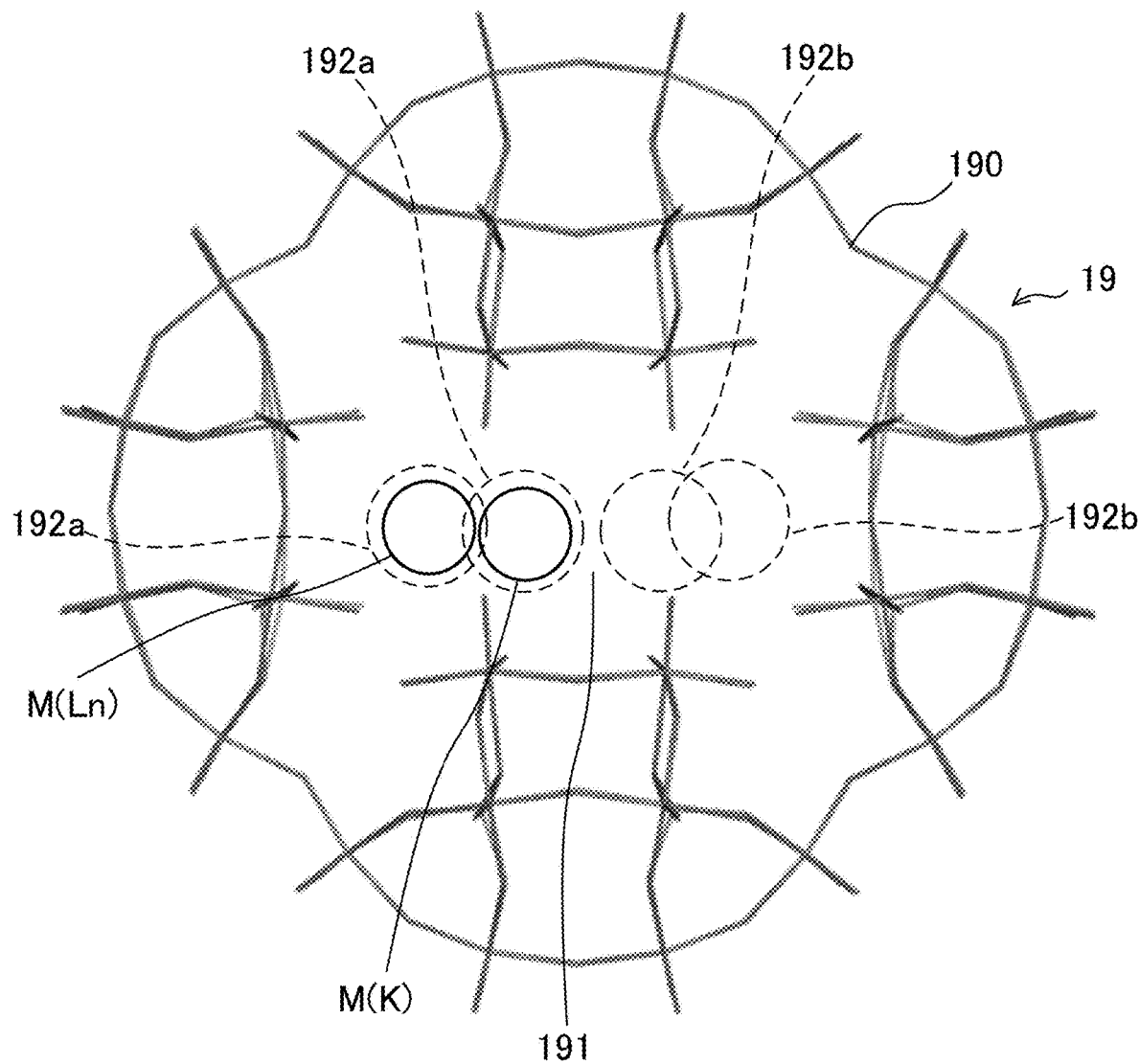
FIG. 31 is a schematic diagram showing, as viewed in plane, another example of the molecular structure of the single-molecule electret.
Figure 32:
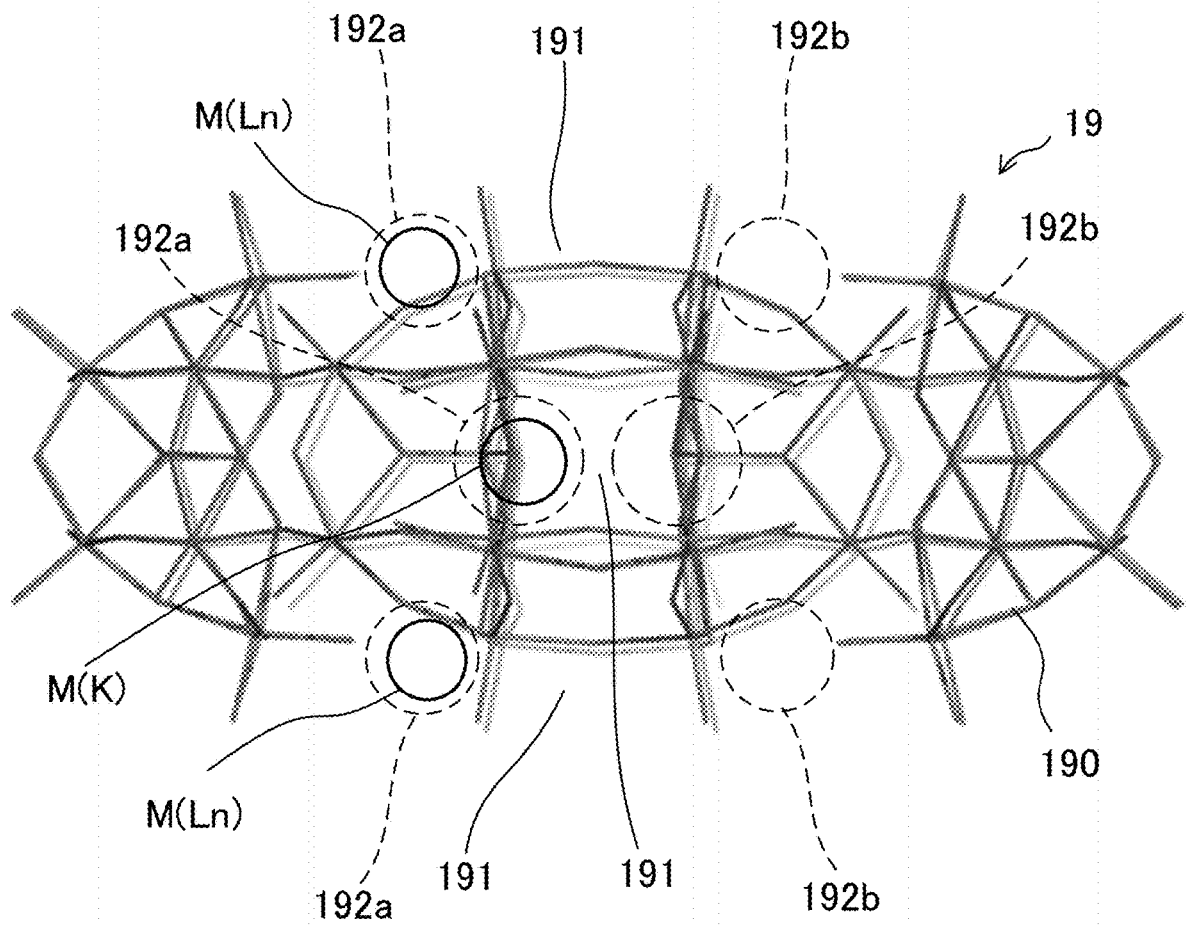
FIG. 32 is a schematic diagram showing, as viewed from the side, another example of the molecular structure of the single-molecule electret.

A molecular metal oxide cluster 19 shown in FIGS. 31 and 32 has, as a cluster skeleton 190, a polyoxometalate skeleton in the shape of such a substantially flat spheroid that the cluster skeleton 100 is extended in a circumferential direction. The cluster skeleton 190 has three continuous holes 191 in a direction substantially perpendicular to the rotation axis of the cluster skeleton 190. Each continuous hole 191 has stable ionic sites 192a, 192b on one and the other opening end sides, and one metal ion M is included in each continuous hole 191. The chemical formula of the molecular metal oxide cluster 19 is represented by $[K^+:P_8W_{48}O_{18}(H_4W_4O_{12})_2\}Ln_2(H_2O)_{10}]^{25-}$ (Ln=La, Ce, Pr, Nd). The metal ions M included in the molecular metal oxide cluster 19 are specifically one potassium ion and two lanthanoid ions. The metal ion M is delocalized (disorder) in the direction substantially perpendicular to the rotation axis, and therefore, it is assumed that physical properties similar to those of the molecular metal oxide cluster 10 are exhibited.

Figure 33:
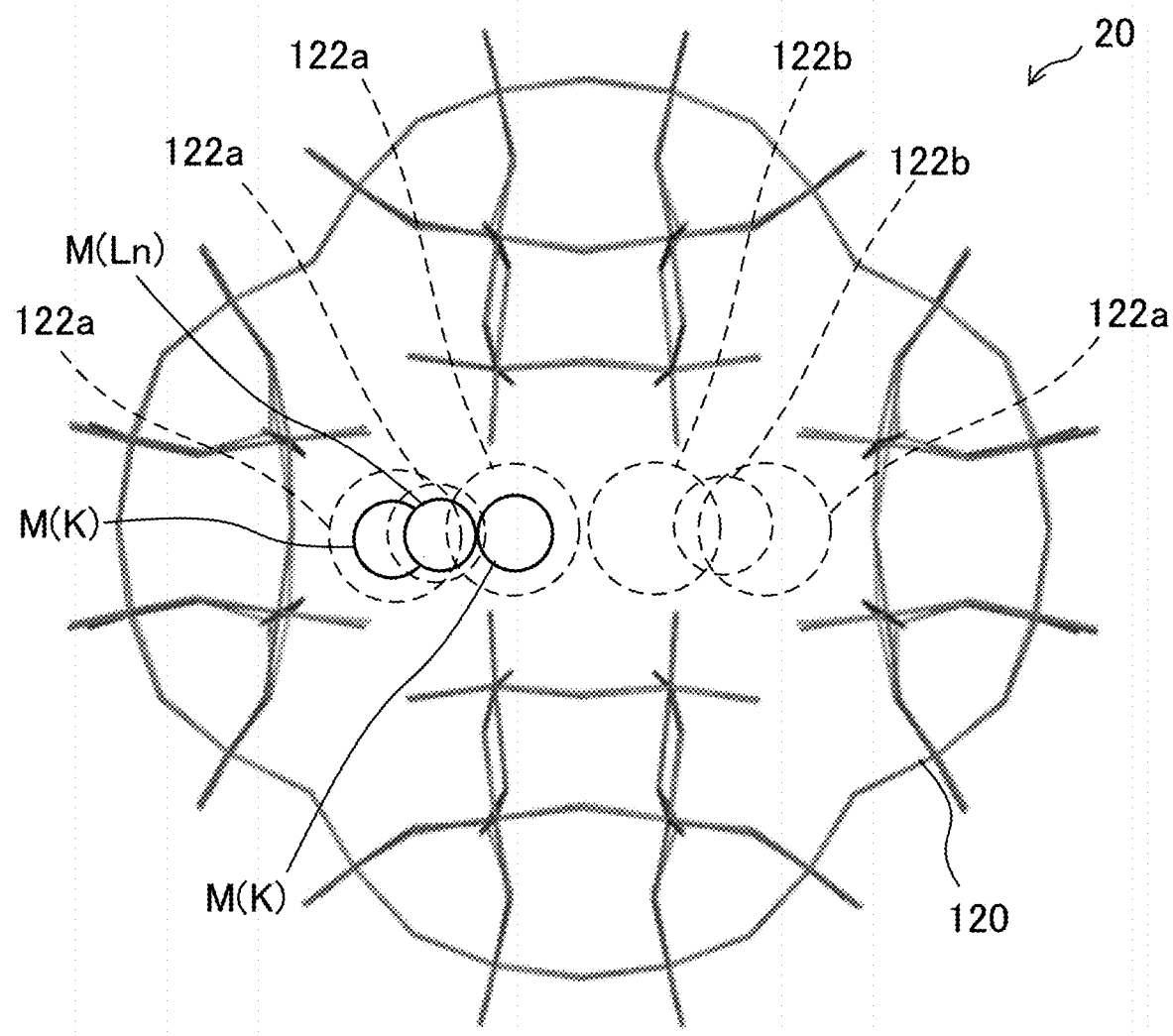
FIG. 33 is a schematic diagram showing, as viewed in plane, another example of the molecular structure of the single-molecule electret.
Figure 34:
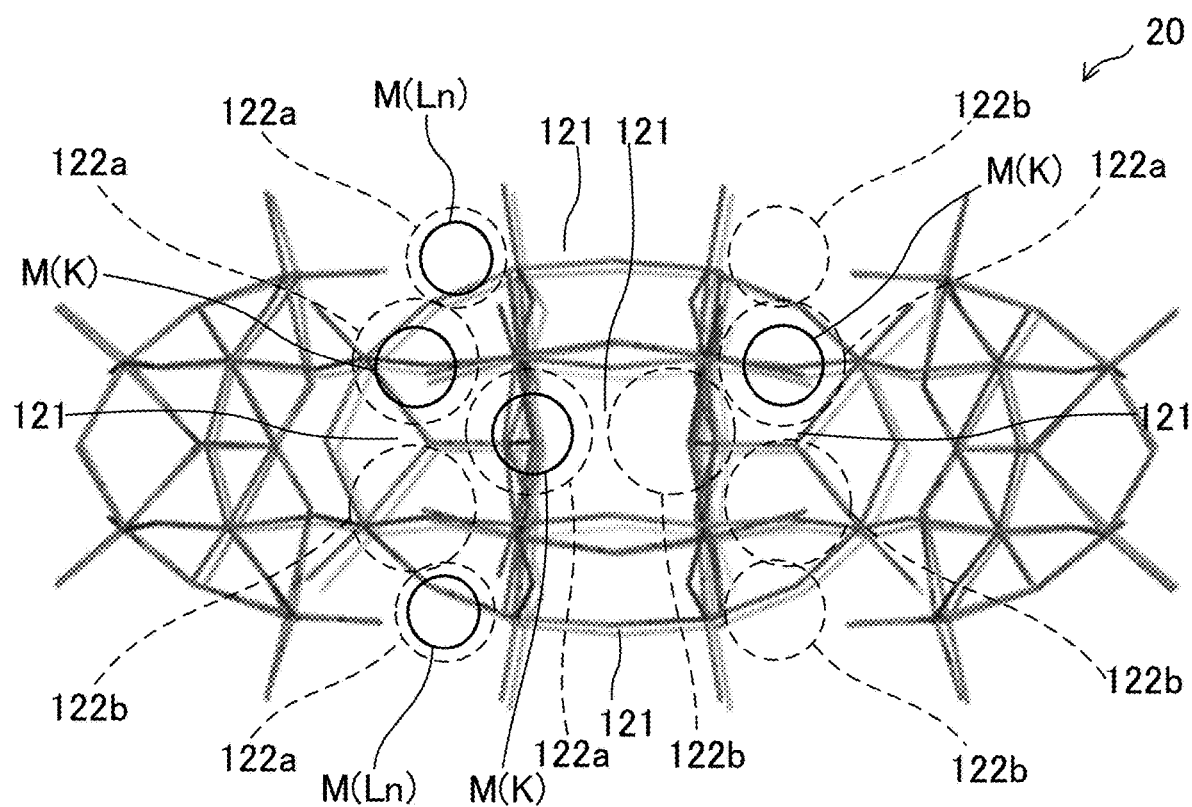
FIG. 34 is a schematic diagram showing, as viewed from the side, another example of the molecular structure of the single-molecule electret.

A molecular metal oxide cluster 20 shown in FIGS. 33 and 34 has, as a cluster skeleton 120, a polyoxometalate skeleton in the shape of such a substantially flat spheroid that the cluster skeleton 100 is extended in a circumferential direction. The cluster skeleton 120 has five continuous holes 121 in a direction substantially parallel with the rotation axis of the cluster skeleton 120 and a direction substantially perpendicular to the rotation axis. Each continuous hole 121 has stable ionic sites 122a, 122b on one and the other opening end sides, and one metal ion M is included in each continuous hole 121. The chemical formula of the molecular metal oxide cluster 20 is represented by $[K^+_3:P_8W_{48}O_{18}(H_4W_4O_{12})_2\}Ce_2(H_2O)_{10}]^{25-}$. The metal ions M included in the molecular metal oxide cluster 20 are specifically three potassium ions and two cerium ions. Of three potassium ions, two potassium ions are delocalized (disorder) in the direction substantially parallel with the rotation axis, and the remaining one potassium ion and two cerium ions are delocalized (disorder) in the direction substantially perpendicular to the rotation axis. Thus, it is assumed that physical properties similar to those of the molecular metal oxide cluster 10 are exhibited.

Figure 35:
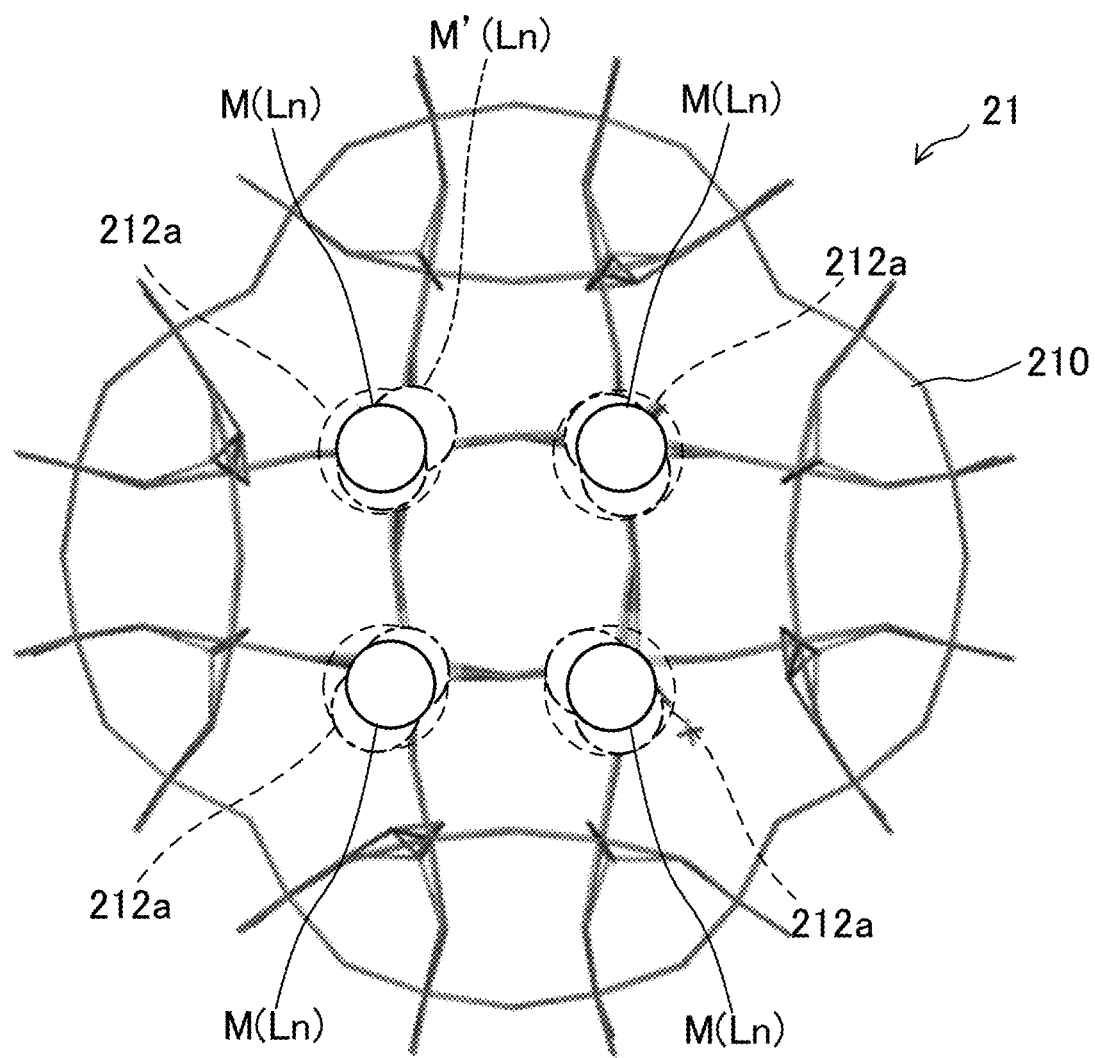
FIG. 35 is a schematic diagram showing, as viewed in plane, another example of the molecular structure of the single-molecule electret.
Figure 36:
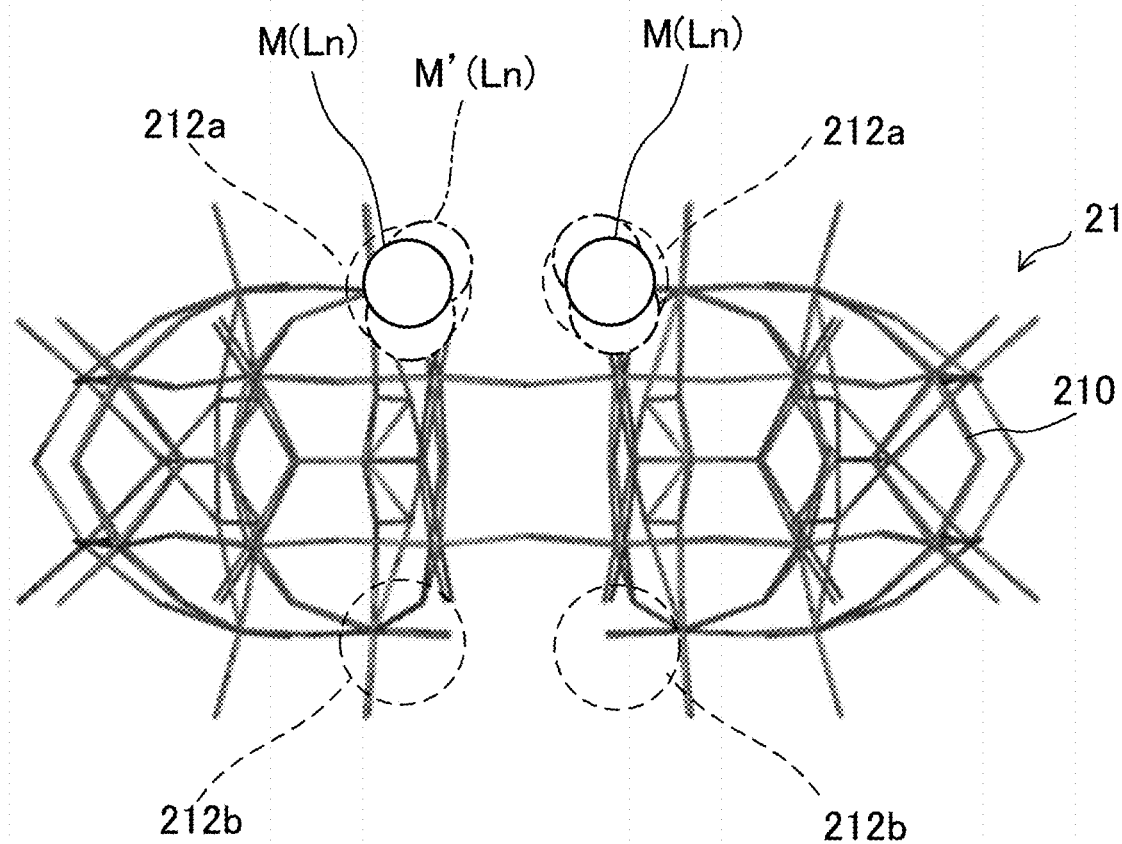
FIG. 36 is a schematic diagram showing, as viewed from the side, another example of the molecular structure of the single-molecule electret.

A molecular metal oxide cluster 21 shown in FIGS. 35 and 36 has, as a cluster skeleton 210, a polyoxometalate skeleton in the shape of such a substantially flat spheroid that the cluster skeleton 100 is extended in a circumferential direction. The cluster skeleton 210 has four metal ions M (lanthanoid ions), and two stable ionic sites 212a, 212b provided apart from each other for each metal ion M are present. The molecular metal oxide cluster 21 has the total of eight stable ionic sites, and four metal ions M are randomly delocalized (disorder) among these eight stable ionic sites. Moreover, each metal ion M is further delocalized (disorder) in the stable ionic sites 212a, 212b. Thus, it is assumed that the molecular metal oxide cluster 21 exhibits, by voltage application, physical properties similar to those of the molecular metal oxide cluster 10. Note that the chemical formula of the molecular metal oxide cluster 21 is represented by $\{[Ln^{3+}_2(\mu\text{-}OH)_4(H_2O)_x]_2[H_{24}P_8W_{48}O_{184}]\}^{12-}$ (Ln=Nd, Sm, Tb).

In these molecular metal oxide clusters 14, 15, 16, 17, 18, 19, 20, 21 having the polyoxometalate skeletons, the metal ions M are delocalized (disorder) among the stable ionic sites, and therefore, effects similar to those of the above-described molecular metal oxide cluster 10 are expected. Note that the metal ion M is not limited to those described above and other metal ions M may be used as long as the metal ion M is delocalized (disorder) in the cluster skeleton.

Figure 37:
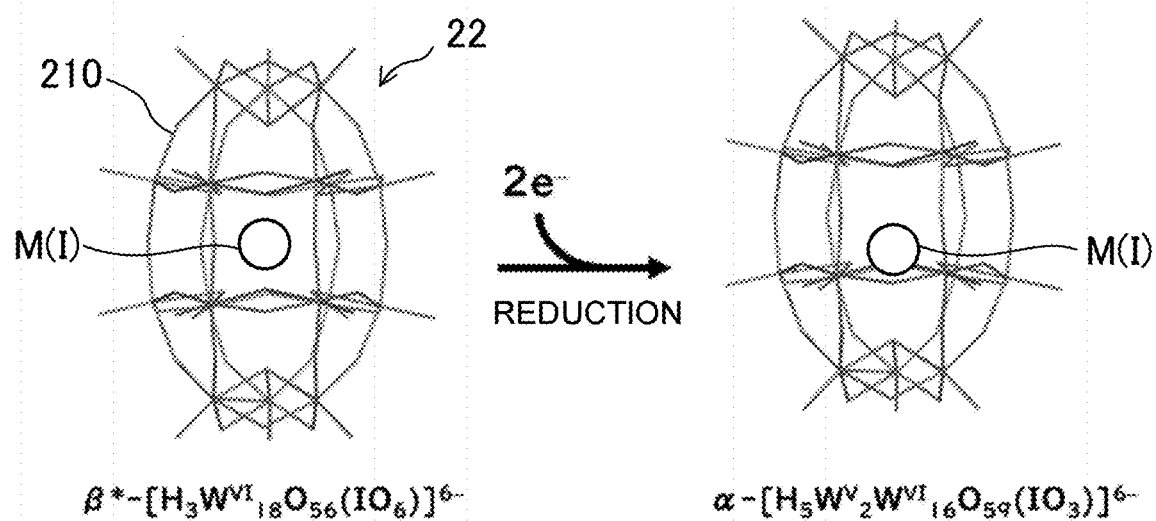
FIG. 37 is a schematic diagram showing the reduction reaction of another example of the molecular structure of the single-molecule electret.

A molecular metal oxide cluster 22 shown in FIG. 37 has a cluster skeleton 220, and includes iodine as a metal ion. The chemical formula of the molecular metal oxide cluster 22 is represented by $[H_3W_{18}O_{56}(IO_6)]^{6-}$. When two tungsten atoms of the cluster skeleton 220 are reduced from hexavalent tungsten to pentavalent tungsten by the reduction reaction, coordination environment around iodine at the center of the cluster skeleton 220 changes, and accordingly, iodine displaces to one side of the cluster skeleton 220. The position of the metal ion M is controlled by the oxidation-reduction reaction, and therefore, effects similar to those of the above-described molecular metal oxide cluster 10 are expected.

INDUSTRIAL APPLICABILITY

As described above, according to the present invention, the metal ion to be included is selected so that the molecular metal oxide cluster can be applied to various electronic devices.

DESCRIPTION OF REFERENCE CHARACTERS

10 Molecular Metal Oxide Cluster
11 Molecular Metal Oxide Cluster
12 Molecular Metal Oxide Cluster
13 Molecular Metal Oxide Cluster
100 Cluster Skeleton
101 Continuous Hole
102a Stable Ionic Site
102b Stable Ionic Site
200 Storage Device
206 Volatile Memory
207 Non-Volatile Memory
M Metal Ion

The invention claimed is:

1. A molecular memory comprising:
a single-molecule electret layer having a single-molecule electret showing molecular polarization and recording the molecular polarization of the single-molecule electret in association with a signal of 0 or 1, wherein:
the single-molecule electret includes a cluster skeleton having a continuous hole and a plurality of stable ionic sites provided apart from each other in the continuous hole and a metal ion included in any one of the stable ionic sites and formed movable to the other hollow stable ionic site,
the molecular polarization is shown in a state in which the metal ion is included in any one of the stable ionic sites,
the molecular polarization is changed by movement of the metal ion to the other hollow stable ionic site by application of an electric field,
a recordkeeping time of the molecular memory in a temperature range of −100° C. to 100° C. is on an ion radius of the metal ion being $3.0 \times 10^{-2}$ seconds to $9.1 \times 10^{22}$ seconds, and
based on the recordkeeping time, the molecular memory is used as any of a volatile memory, a non-volatile memory, and a storage class memory.

2. The molecular memory of claim 1, wherein:
by a change in an electronic state of the single-molecule electret by oxidization reaction or reduction reaction, the recordkeeping time in the case of using the single-molecule electret after the reaction is different from the recordkeeping time in the case of using the single-molecule electret before the reaction.

3. The molecular memory of claim 2, wherein:
the cluster skeleton is a polyoxometalate skeleton, and the metal ion is delocalized in the cluster skeleton.

4. The molecular memory of claim 3, wherein:
the cluster skeleton is a polyoxometalate skeleton having two stable ionic sites and represented by a chemical formula of $P_5W_{30}O_{110}$ or $\{W_2Co_2O_8(H_2O)_2\}P_4W_{24}O_{92}$.

5. The molecular memory of claim 4, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a gadolinium ion ($Gd^{3+}$), a terbium ion ($Tb^{3+}$), a dysprosium ion ($Dy^{3+}$), a holmium ion ($Ho^{3+}$), an erbium ion ($Er^{3+}$), a thulium ion ($Tm^{3+}$), and an ytterbium ion ($Yb^{3+}$), and
as the ion radius of the metal ion increases, an activation energy when the molecular polarization of the single-molecule electret changes increases.

6. The molecular memory of claim 4, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
as the ion radius of the metal ion increases, the recordkeeping time increases.

7. The molecular memory of claim 6, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at −100° C. is $1.5 \times 10^{10}$ seconds to $9.1 \times 10^{22}$ seconds.

8. The molecular memory of claim 6, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at −50° C. is $2.0 \times 10^5$ seconds to $8.8 \times 10^{13}$ seconds.

9. The molecular memory of claim 6, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at 27° C. is $8.8 \times 10^0$ seconds to $8.7 \times 10^5$ seconds.

10. The molecular memory of claim 1, wherein:
the cluster skeleton is a polyoxometalate skeleton, and the metal ion is delocalized in the cluster skeleton.

11. The molecular memory of claim 10, wherein:
the cluster skeleton is a polyoxometalate skeleton having two stable ionic sites and represented by a chemical formula of $P_5W_{30}O_{110}$ or $\{W_2Co_2O_8(H_2O)_2\}P_4W_{24}O_{92}$.

12. The molecular memory of claim 11, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a gadolinium ion ($Gd^{3+}$), a terbium ion ($Tb^{3+}$), a dysprosium ion ($Dy^{3+}$), a holmium ion ($Ho^{3+}$), an erbium ion ($Er^{3+}$), a thulium ion ($Tm^{3+}$), and an ytterbium ion ($Yb^{3+}$), and
as the ion radius of the metal ion increases, an activation energy when the molecular polarization of the single-molecule electret changes increases.

13. The molecular memory of claim 11, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
as the ion radius of the metal ion increases, the recordkeeping time increases.

14. The molecular memory of claim 13, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at $-100°$ C. is $1.5 \times 10^{10}$ seconds to $9.1 \times 10^{22}$ seconds.

15. The molecular memory of claim 13, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at $-50°$ C. is $2.0 \times 10^5$ seconds to $8.8 \times 10^{13}$ seconds.

16. The molecular memory of claim 13, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at $27°$ C. is $8.8 \times 10^0$ seconds to $8.7 \times 10^5$ seconds.

17. The molecular memory of claim 13, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at $50°$ C. is $1.1 \times 10^0$ seconds to $1.9 \times 10^4$ seconds.

18. The molecular memory of claim 13, wherein:
the cluster skeleton is a polyoxometalate skeleton having two stable ionic sites and represented by a chemical formula of $P_5W_{30}O_{110}$,
the metal ion is one type selected from a group consisting of a sodium ion ($Na^+$), a dysprosium ion ($Dy^{3+}$), a thulium ion ($Tm^{3+}$), and an ytterbium ion ($Yb^{3+}$), and
the recordkeeping time at $100°$ C. is $3.0 \times 10^{-2}$ seconds to $2.5 \times 10^1$ seconds.

19. A method for manufacturing a molecular memory including a single-molecule electret layer having a single-molecule electret showing molecular polarization and recording the molecular polarization of the single-molecule electret in association with a signal of 0 or 1, wherein:
the single-molecule electret includes a cluster skeleton having a continuous hole and a plurality of stable ionic sites provided apart from each other in the continuous hole and a metal ion included in any one of the stable ionic sites and formed movable to the other hollow stable ionic site,
the molecular polarization is shown in a state in which the metal ion is included in any one of the stable ionic sites, and
the molecular polarization is changed by movement of the metal ion to the other hollow stable ionic site by application of an electric field,
the method comprising at least:
a step of specifying any of a volatile memory, a storage class memory, and a non-volatile memory as a use of the molecular memory;
a step of determining a recordkeeping time of the molecular memory based on the specified use; and
a step of selecting the metal ion based on the determined recordkeeping time such that the selected metal ion is included in the cluster skeleton.

20. The molecular memory manufacturing method of claim 19, further comprising:
an oxidization-reduction step of changing the recordkeeping time by changing an electronic state of the single-molecule electret by oxidization reaction or reduction reaction.

* * * * *